United States Patent
Lewis et al.

(10) Patent No.: US 7,573,317 B2
(45) Date of Patent: Aug. 11, 2009

(54) APPARATUS AND METHODS FOR ADJUSTING PERFORMANCE OF INTEGRATED CIRCUITS

(75) Inventors: David Lewis, Toronto (CA); Vaughn Betz, Toronto (CA); Irfan Rahim, San Jose, CA (US); Peter McElheny, Morgan Hill, CA (US); Yow-Juang W. Liu, San Jose, CA (US); Bruce Pedersen, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/535,065

(22) Filed: Sep. 26, 2006

(65) Prior Publication Data

US 2007/0069764 A1 Mar. 29, 2007

Related U.S. Application Data

(60) Division of application No. 10/865,402, filed on Jun. 10, 2004, now Pat. No. 7,129,745, which is a continuation-in-part of application No. 10/848,953, filed on May 19, 2004, now Pat. No. 7,348,827.

(51) Int. Cl.
*H03K 3/01* (2006.01)

(52) U.S. Cl. .......... 327/534; 327/530; 327/537
(58) Field of Classification Search .......... 327/530, 327/534, 537
See application file for complete search history.

(56) References Cited

U.S. PATENT DOCUMENTS

| 5,880,620 | A  | * | 3/1999 | Gitlin et al. .......... 327/534 |
| 6,429,726 | B1 | * | 8/2002 | Bruneau et al. .......... 327/537 |
| 6,529,421 | B1 | * | 3/2003 | Marr et al. .......... 365/189.09 |
| 6,590,440 | B1 | * | 7/2003 | Williams et al. .......... 327/396 |
| 6,621,325 | B2 | * | 9/2003 | Hart et al. .......... 327/534 |
| 7,332,953 | B2 | * | 2/2008 | Pineda De Gyvez et al. 327/534 |
| 2004/0123170 | A1 | * | 6/2004 | Tschanz et al. .......... 713/320 |
| 2006/0038605 | A1 | * | 2/2006 | Pineda De Gyvez et al. 327/534 |

\* cited by examiner

*Primary Examiner*—Vibol Tan
(74) *Attorney, Agent, or Firm*—Law Offices of Maximilian R. Peterson

(57) ABSTRACT

A programmable logic device (PLD) includes a delay circuit and a body-bias generator. The delay circuit has a delay configured to represent a delay of user circuit implement in the PLD. The body-bias generator is configured to adjust the body bias of a transistor within the user circuit. The body-bias generator adjusts the body bias of the transistor in response to a level derived from the signal propagation delay of the delay circuit.

28 Claims, 24 Drawing Sheets

APPARATUS AND METHODS FOR ADJUSTING PERFORMANCE OF INTEGRATED CIRCUITS

CROSS-REFERENCE TO RELATED APPLICATIONS

This patent application is a divisional application of, and incorporates by reference, U.S. patent application Ser. No. 10/865,402, titled "Apparatus and Methods for Adjusting Performance of Integrated Circuits," filed on Jun. 10, 2004 now U.S. Pat. No. 7,129,745, which is a continuation-in-part application of, and incorporates by reference, U.S. patent application Ser. No. 10/848,953, titled "Apparatus and Methods for Adjusting the Performance of Programmable Logic Devices," filed on May 19, 2004 now U.S. Pat. No. 7,348,827.

TECHNICAL FIELD

The inventive concepts relate generally to adjusting the performance of integrated circuits (ICs), including programmable logic devices (PLDs).

BACKGROUND

PLDs are ubiquitous electronic devices that provide flexibility to not only designers, but also end-users. During the design cycle of an electronic circuit or system, a designer may perform a relatively large number of design iterations by simply re-programming the PLD for each design. Thus, the length and expense of the design cycle decreases compared to other alternatives. Similarly, the end-user may have a desired level of control over the functionality of a design that includes PLD(s). By programming the PLD(s) in the field or even on a real-time basis, the user can change the way the circuit or system behaves.

To accommodate increasingly complex designs, modern PLDs include a relatively large number of transistors. Furthermore, users demand ever higher performance, which results in larger operating frequencies. Consequently, the power consumption, power dissipation, die temperatures and, hence, power density (power dissipation in various circuits or blocks), of PLDs has tended to increase. The upward march of the power density, however, may make PLDs design and implementation impractical or failure-prone. A need exists for PLDs that feature adjustable power consumption and performance. A further need exists for directly controlling the performance (leakage, speed, and power dissipation) of transistors within general ICs.

SUMMARY

The disclosed novel concepts relate to apparatus and methods for adjusting the performance of PLDs, for example, by making a speed-power consumption trade-off. One aspect of the inventive concepts relates to apparatus for adjusting the performance of PLDs. In one embodiment, a PLD configured to implement a user's circuit includes a delay circuit and a body-bias generator. The delay circuit has a delay that represents the delay of a user's circuit implemented in the PLD. The user's circuit includes at least one transistor. The body-bias generator adjusts a body bias of the transistor in the user's circuit in response to a quantity derived from the propagation delay of the delay circuit.

In another embodiment, a PLD includes a reference transistor, a current measurement circuit, and body-bias generator. The reference transistor provides a current relates to a circuit within the PLD. The current measurement circuit measures the current provided by the reference transistor, and provides a measured current signal to the body-bias generator. The body-bias generator derives at least one body-bias signal from the measured current signal, and provides the body bias-signal(s) to the circuit in the PLD.

In yet another embodiment, a PLD includes a plurality of user circuits and a plurality of body-bias generators. Each of the user circuits is implemented in the PLD. At least one of the plurality of body-bias generators is configured to selectively adjust a body bias of a transistor within at least one of the user circuits.

Another aspect of the inventive concepts relates to methods of adjusting the performance of PLDs and using PLDs to implement a user's circuits. In one embodiment, a method of using a PLD to implement an electronic circuit includes mapping the electronic circuit to functional resources within the PLD to generate a design, and deriving a body-bias value from a delay representative of a signal propagation delay within at least one portion of the generated design. The method further includes programming a body-bias level of at least one transistor within the portion of the generated design to the body-bias value.

In another embodiment, t method of adjusting a leakage level of a transistor in a circuit embodied within a PLD includes obtaining a current that represents a leakage current of the transistor, and deriving a body-bias level from the obtained current. The method further includes adjusting the body bias of the transistor to the derived body-bias level.

In yet another embodiment, a method of realizing a user's circuit in at least one circuit region in a PLD includes selecting a body-bias level for at least one transistor in the circuit region, and generating an initial placement of the circuit region within the PLD. The method further includes changing at least once the body-bias level to be applied to the transistor(s) in the circuit region to another level if the existing body-bias level and placement fail to meet prescribed performance criteria.

BRIEF DESCRIPTION OF THE DRAWINGS

The appended drawings illustrate only exemplary embodiments of the invention and therefore should not be considered as limiting its scope. Persons of ordinary skill in the art who have the benefit of the description of the invention appreciate that the disclosed inventive concepts lend themselves to other equally effective embodiments. In the drawings, the same numeral designators used in more than one drawing denote the same, similar, or equivalent functionality, components, or blocks.

DETAILED DESCRIPTION

The inventive concepts contemplate apparatus and associated methods for PLDs that feature adjustable power and performance. The inventive concepts help to overcome excessive power density levels that conventional PLDs suffer. Moreover, one may adjust the performance level of a desired portion, or all, of a PLD according to the invention (i.e., on a granular basis ranging from individual transistors all the way to the entire PLD circuitry).

More specifically, and as described below in detail, the inventive concepts contemplate setting, programming, or adjusting the body or well bias of individual transistors, or groups of transistors, in a PLD. Adjusting the body bias varies the power consumption and performance of the transistor(s).

The inventive concepts provide the following benefits over traditional implementations. First, they allow trading off performance and power consumption or optimizing the performance-power consumption tradeoff. Second, one may selectively set, program, or adjust the body-bias level(s) in critical circuit paths or parts of the PLD so as to increase their performance as desired. Conversely, one may selectively set, program, or adjust the body-bias level(s) in non-critical circuit paths or parts of the PLD and therefore reduce their power consumption and lower their power densities.

In addition, one may shut down or disable unused parts or circuits within the PLD, thus reduce their power consumption and lower their power densities. One may also employ the inventive concepts to prevent (or reduce the probability of) thermal runaway. More specifically, in a traditional PLD, circuits operating at relatively high speeds tend to consume more power, resulting in temperature increase of the PLD. The increased power consumption may cause those circuits to consume more power. This positive feedback mechanism may increase the power densities to unsafe or destructive levels.

Figure 1:
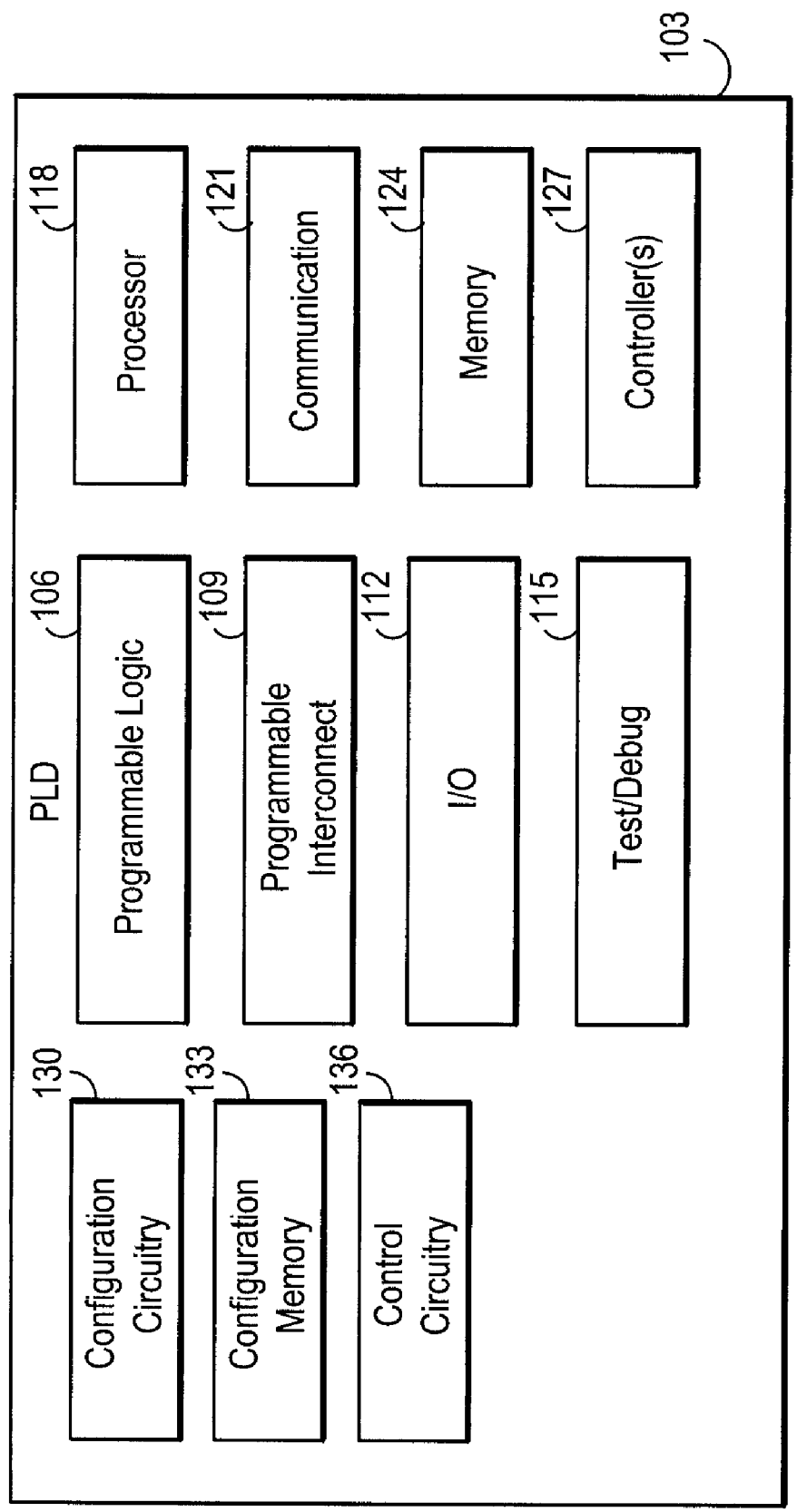
FIG. 1 shows a general block diagram of a PLD according to an illustrative embodiment of the invention.

FIG. 1 shows a general block diagram of a PLD 103 according to an illustrative embodiment of the invention. PLD 103 includes configuration circuitry 130, configuration memory 133, control circuitry 136, programmable logic 106, programmable interconnect 109, and I/O circuitry 112. In addition, PLD 103 may include test/debug circuitry 115, one or more processors 118, one or more communication circuitry 121, one or more memories 124, one or more controllers 127, as desired.

Note that FIG. 1 shows a simplified block diagram of PLD 103. Thus, PLD 103 may include other blocks and circuitry, as persons of ordinary skill in the art understand. Examples of such circuitry include clock generation and distribution circuits, redundancy circuits, and the like. Furthermore, PLD 103 may include, analog circuitry, other digital circuitry, and/or mixed-mode circuitry, as desired.

Programmable logic 106 includes blocks of configurable or programmable logic circuitry, such as look-up tables (LUTs), product-term logic, multiplexers, logic gates, registers, memory, and the like. Programmable interconnect 109 couples to programmable logic 106 and provides configurable interconnects (coupling mechanisms) between various blocks within programmable logic 106 and other circuitry within or outside PLD 103.

Control circuitry 136 controls various operations within PLD 103. Under the supervision of control circuitry 136, PLD configuration circuitry 130 uses configuration data (which it obtains from an external source, such as a storage device, a host, etc.) to program or configure the functionality of PLD 103. The configuration data determine the functionality of PLD 103 by programming programmable logic 106 and programmable interconnect 109, as persons skilled in the art with the benefit of the description of the invention understand.

I/O circuitry 112 may constitute a wide variety of I/O devices or circuits, as persons of ordinary skill in the art who have the benefit of the description of the invention understand. I/O circuitry 112 may couple to various parts of PLD 103, for example, programmable logic 106 and programmable interconnect 109. I/O circuitry 112 provides a mechanism and circuitry for various blocks within PLD 103 to communicate with external circuitry or devices.

Test/debug circuitry 115 facilitates the testing and troubleshooting of various blocks and circuits within PLD 103. Test/debug circuitry 115 may include a variety of blocks or circuits known to persons of ordinary skill in the art who have the benefit of the description of the invention. For example, test/debug circuitry 115 may include circuits for performing tests after PLD 103 powers up or resets, as desired. Test/debug circuitry 115 may also include coding and parity circuits, as desired.

As noted above, PLD 103 may include one or more processors 118. Processor 118 may couple to other blocks and circuits within PLD 103. Processor 118 may receive data and information from circuits within or external to PLD 103 and process the information in a wide variety of ways, as persons skilled in the art with the benefit of the description of the invention appreciate. One or more of processor(s) 118 may constitute a digital signal processor (DSP). DSPs allow performing a wide variety of signal processing tasks, such as compression, decompression, audio processing, video processing, filtering, and the like, as desired.

PLD 103 may also include one or more communication circuitry 121. Communication circuitry 121 may facilitate data and information exchange between various circuits within PLD 103 and circuits external to PLD 103, as persons of ordinary skill in the art who have the benefit of the description of the invention understand. As an example, communication circuitry 121 may provide various protocol functionality (e.g., Transmission Control Protocol/Internet Protocol (TCP/IP), User Datagram Protocol (UDP) etc.), as desired. As another example, communication circuitry 121 may include network (e.g., Ethernet, token ring, etc.) or bus interface circuitry, as desired.

PLD 103 may further include one or more memories 124 and one or more controller(s) 127. Memory 124 allows the storage of various data and information (such as user-data, intermediate results, calculation results, etc.) within PLD 103. Memory 124 may have a granular or block form, as desired. Controller 127 allows interfacing to, and controlling the operation and various functions of circuitry outside the PLD. For example, controller 127 may constitute a memory controller that interfaces to and controls an external synchronous dynamic random access memory (SDRAM), as desired.

The blocks of circuitry within PLD 103 include a number of transistors. More particularly, the transistors constitute metal oxide semiconductor (MOS) transistors, such as N-type MOS (NMOS), P-type MOS (PMOS), complementary MOS (CMOS), or partially depleted silicon-on-insulator (SOI) MOS transistors (or a combination of those types of transistors), as desired.

Figure 2:
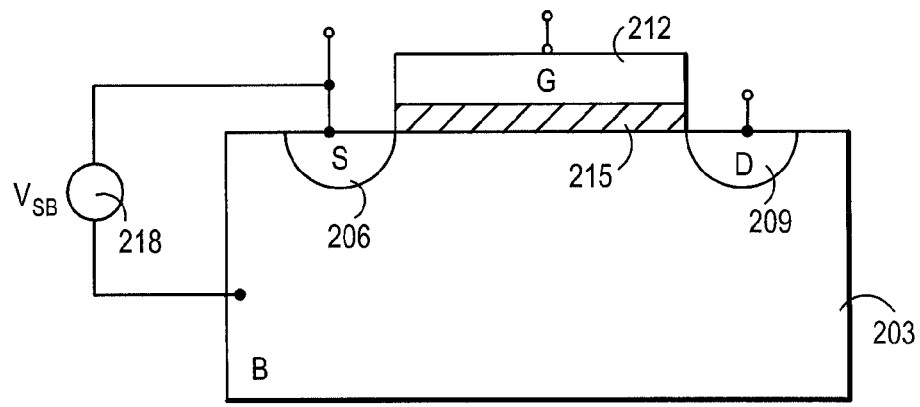
FIG. 2 illustrates a MOS transistor used in exemplary embodiments according to the invention.

FIG. 2 shows a MOS transistor used in exemplary embodiments according to the invention. The MOS transistor includes body (or substrate) region 203, source region 206, drain region 209, gate insulator 215, and gate 212. The drain current of the MOS transistor in the saturation region of operation depends on the threshold voltage and the gate-to-source voltage of the transistor:

$$i_D = K(v_{GS} - V_T)^2 \quad (1)$$

where
$i_D$ = the total drain current (i.e., including AC and DC components),
K = a constant,
$v_{GS}$ = the total gate-to-source voltage (i.e., including AC and DC components), and
$V_T$ = the threshold voltage.

The threshold voltage, $V_T$, depends on a number of factors, such as the voltage between source region 206 and body region 203 of the transistor. The following equation provides the threshold voltage as a function of the body-to-source voltage:

$$V_T = V_{T(0)} + \gamma \{ \sqrt{2\phi_F - v_{BS}} - \sqrt{2\phi_F} \}. \quad (2A)$$

Alternatively, one may write Equation 2A in terms of the source-to-body voltage:

$$V_T = V_{T(0)} + \gamma \{ \sqrt{2\phi_F + v_{SB}} - \sqrt{2\phi_F} \}, \quad (2B)$$

where
$V_{T(0)}$ = the threshold voltage with the source-to-body voltage (or body-to-source voltage) set to zero,
$\gamma$ = the body factor, a constant that depends on the doping levels of the body,
$\phi_F$ = a constant,
$v_{BS}$ = the total body-to-source voltage (i.e., including AC and DC components), and
$v_{SB}$ = the total source-to-body voltage (i.e., including AC and DC components).

Note that when the body-to-source voltage, $v_{BS}$ (or source-to-body voltage, $v_{SB}$) equals zero, the threshold voltage, $V_T$, equals $V_{T(0)}$.

As Equation 2B shows, for a finite body factor, $\gamma$, the transistor's threshold voltage increases as the source-to-body voltage, $v_{SB}$, increases. Equation 1, however, indicates that for a given gate-to-source voltage an increase in the threshold voltage decreases the drain current, $i_D$, of the transistor. In other words, according to Equations 1 and 2B, for a constant gate-to-source-voltage, $v_{GS}$, an increase in the source-to-body voltage, $v_{SB}$, causes an increase in the threshold voltage, $V_T$.

An increased threshold voltage, $V_T$, in turn causes a decrease in the quantity $(v_{GS} - V_T)$ and, consequently, a decrease in the drain current, $i_D$, of the transistor. Thus, for a constant gate-to-source-voltage, $v_{GS}$, an increase in the source-to-body voltage, $v_{SB}$, causes a decrease in the current-drive capability (one measure of performance) of the transistor. The decreased current-drive capability of the transistor in turn leads to slower circuit operation and, ultimately, to slower operation of the PLD that includes the transistor.

The power dissipation of the transistor also varies according to changes in its threshold voltage. More specifically, a smaller threshold voltage increases the OFF-state leakage current ($I_{off}$) of the transistor, and vice-versa. The $I_{off}$ of the transistor affects its static (non-switching) power dissipation. In addition, a smaller threshold voltage decreases the dynamic or switching power dissipation of the transistor. Thus, changing the threshold voltage by adjusting the body bias affects the power dissipation of the MOS transistor.

Furthermore, for a given supply voltage, $V_{DD}$, an increase in the threshold voltage, $V_T$, limits the maximum voltage that the transistor can transmit when operating as a pass transistor. In other words, if the threshold voltage, $V_T$, increases to the point that it equals or exceeds the gate-to-source-voltage, $v_{GS}$, the drain current reduces to zero. Thus, a voltage applied to the drain of the transistor, for example, a voltage that corresponds to a logic 1 level, fails to properly transmit to the source of the transistor. Consequently, the transistor fails to operate reliably as a pass transistor.

As the above description shows, one may affect the performance of the MOS transistor by adjusting its body bias and hence its source-to-body voltage (ultimately resulting in a chance in its threshold voltage). Adjusting the body bias affects performance measures such as current-drive capability, speed of operation, power dissipation, etc.

As noted above, in embodiments according to the invention, one may adjust the body bias of individual transistors, individual circuits or blocks within the PLD, groups of transistors or blocks, or even the entire PLD, as desired. Furthermore, one may control the body bias of individual NMOS and PMOS transistors, or the body biases of groups of NMOS and PMOS transistors, as desired. The following description provides the details.

Figure 3:
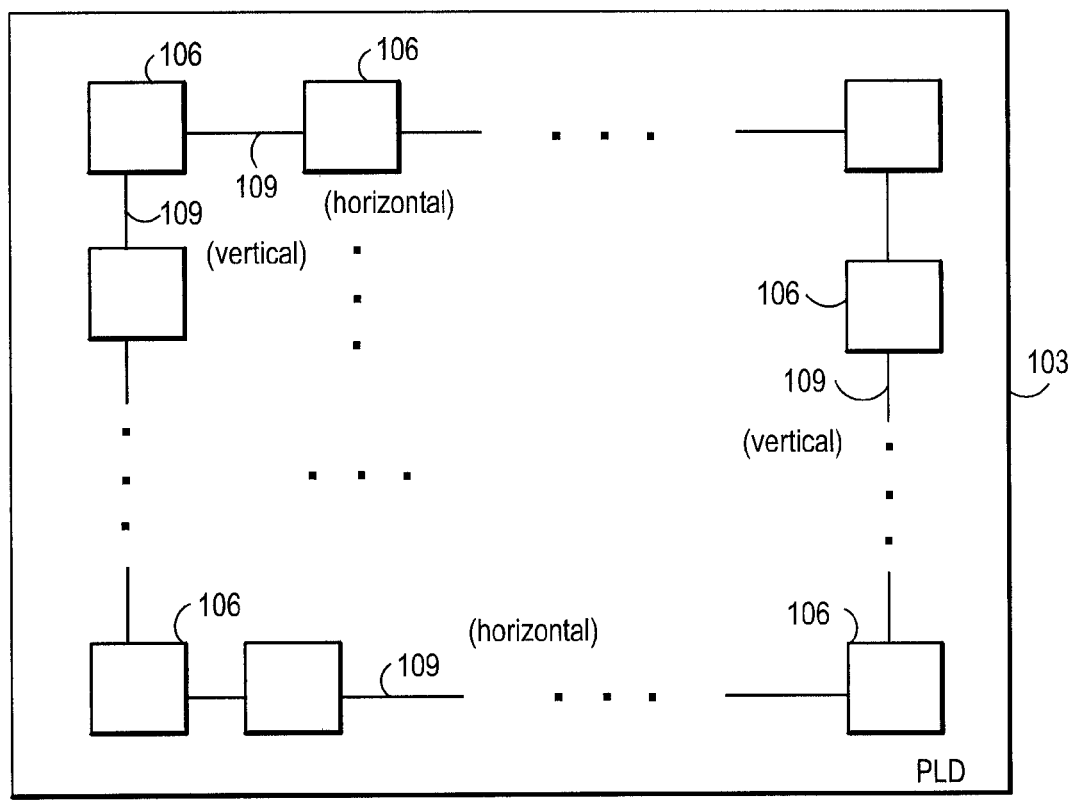
FIG. 3 depicts a floor-plan of a PLD according to an exemplary embodiment of the invention.

FIG. 3 shows a floor-plan of a PLD 103 according to an exemplary embodiment of the invention. PLD 103 includes programmable logic 106 arranged as a two-dimensional array. Programmable interconnect 109, arranged as horizontal interconnect and vertical interconnect, couples the blocks of programmable logic 106 to one another. One may adjust the body bias of each block of programmable logic 106, each segment of programmable interconnect 109, or both, as desired. Furthermore, one may adjust the body bias of a portion of one or more blocks of programmable logic 106, a portion of programmable interconnect 109, or both, as desired.

In illustrative embodiments, PLDs according to the invention have a hierarchical architecture. In other words, each block of programmable logic 106 in FIG. 3 may in turn include smaller or more granular programmable logic blocks or circuits. One may adjust the body bias of transistors in each level of the hierarchical architecture of the PLD, as desired.

Figure 4:
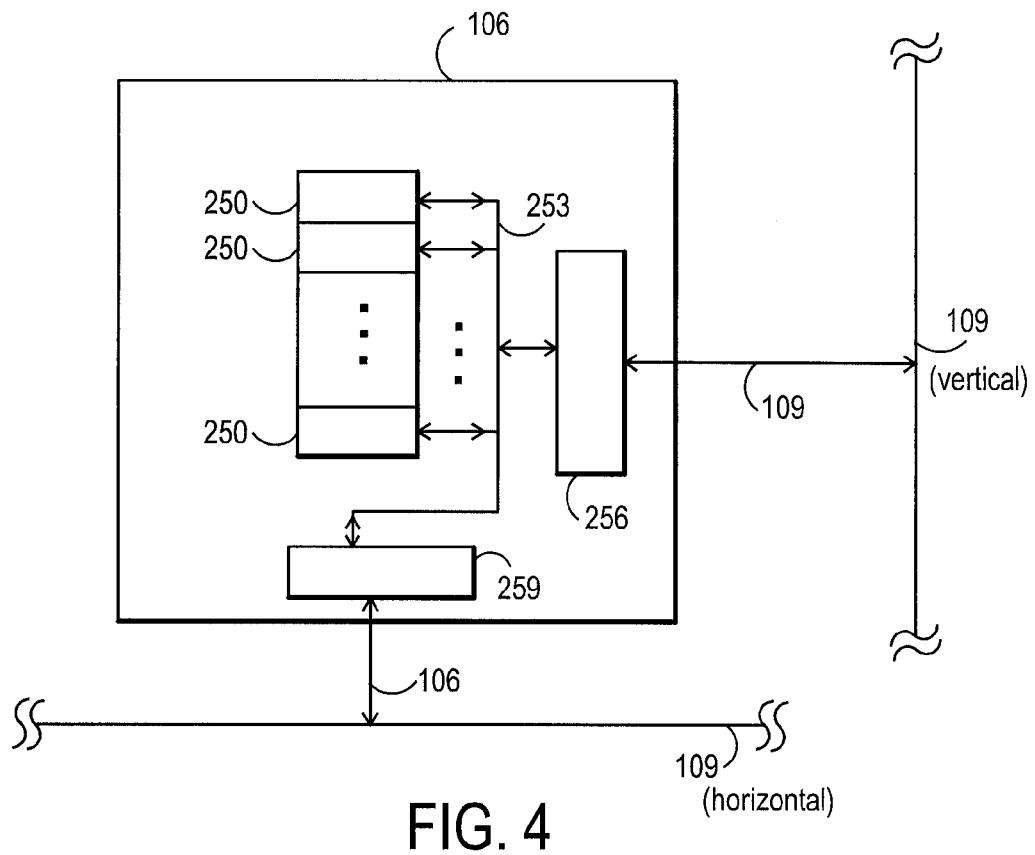
FIG. 4 shows a block diagram of a programmable logic in a PLD according to an exemplary embodiment of the invention.

FIG. 4 shows a block diagram of a programmable logic 106 in a PLD according to an exemplary embodiment of the invention. Programmable logic 106 includes logic elements or programmable logic circuits 250, local interconnect 253, interface circuit 256, and interface circuit 259. Logic elements 250 provide configurable or programmable logic functions, for example, LUTs, registers, product-term logic, etc., as persons of ordinary skill in the art who have the benefit of the description of the invention understand. Local interconnect 253 provides a configurable or programmable mechanism for logic elements 250 to couple to one another or to programmable interconnect 109 (sometimes called "global interconnect"), as desired.

Interface circuit 256 and interface circuit 259 provide a configurable or programmable way for programmable logic 106 block of circuitry to couple to programmable interconnect 109 (and hence to other programmable logic 106, as FIG. 3 shows). Interface circuit 256 and interface circuit 259 may include multiplexers (MUXs), registers, buffers, drivers, and the like, as persons of ordinary skill in the art who have the benefit of the description of the invention understand.

One may adjust the body bias of each portion or block of circuitry within PLD 103 (see FIGS. 1, 3, and 4), as desired. Furthermore, one may adjust the body bias of each portion or block of circuitry independently of others, on an individual or collective basis, as desired. Within each portion or block of circuitry, one may adjust the body bias of each sub-block or transistor, or groups of sub-blocks or transistors, on an individual or collective basis, as desired.

For example, one may adjust the body bias of all or a portion of the following circuitry within a PLD according to exemplary embodiments of the invention: one or more of the blocks in FIG. 1 (e.g. programmable logic 106, programmable interconnect 109, etc.); one or more logic elements 250 within one or more programmable logic blocks 106; one or more interface circuits 256 and/or 259, within one or more programmable logic blocks 106; one or more local interconnect within one or more programmable logic 106; and one or more MUXs, drivers, buffers, etc., within one or more interface circuits 256 and/or 259.

As noted above, one may make the body-bias adjustments in any desired level of granularity. In other words, one may make the adjustments applicable to individual transistors, groups of transistors, sub-blocks, blocks, or the entire PLD, as desired, and as applicable. For example, one may make body-bias adjustments to one or more NMOS transistors independently of one or more PMOS transistors, as desired.

Furthermore, one may adjust the body bias of one element in PLD 103 independently of all other elements, as desired. As persons of ordinary skill in the art with the benefit of the description of the invention understand, one may adjust the body bias some parts of a PLD and yet provide a fixed or default body bias for other parts of the PLD, as desired.

Figure 5:
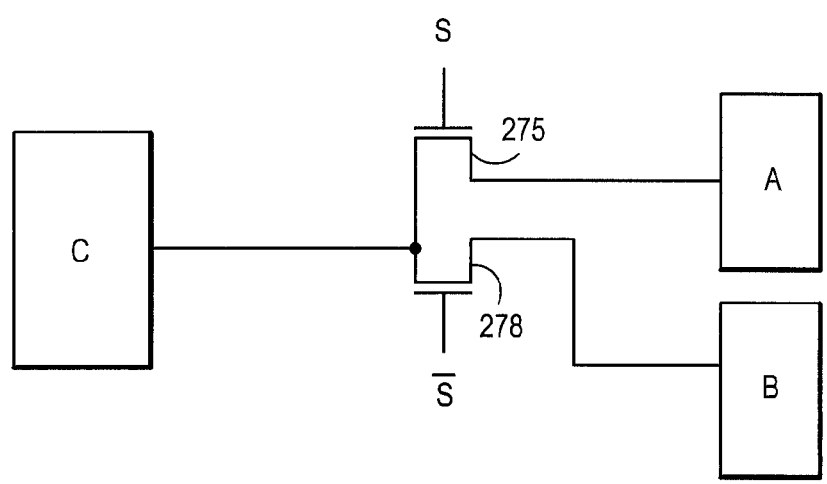
FIG. 5 illustrates a multiplexer used in PLDs according to exemplary embodiments of the invention that incorporate body-bias adjustment.

As an example of the granularity of body-bias adjustment, consider a two-input, one-output MUX. FIG. 5 shows a MUX used in PLDs according to exemplary embodiments of the invention that incorporate body-bias adjustment. The MUX includes transistor 275 and transistor 278. The MUX receives a signal from circuit A and another signal from circuit B. In response to a select signal, S, and its complement, S', the MUX routes to circuit C (coupled to the output of the MUX) either the signal from circuit A or the signal from circuit B.

One may adjust the body biases of transistor 275 and transistor 278 in a number of ways. First, one may choose to not adjust the body biases (e.g., use a default body bias within the PLD). Second, one may adjust the body bias of transistor 275 to the same level as the body bias of transistor 278. As an alternative, one may adjust the body bias of only of transistor 275 and transistor 278. As another choice, one may adjust individually the body biases of each of transistor 275 and transistor 278.

Thus, one may configure the performance properties of the MUX in a flexible manner. Put another way, one may balance or trade off the speed of operation, current-drive capability, and power dissipation of the MUX against one another. As further examples, note that one may extend the body-bias adjustment concept to a set of transistors in a MUX, to a particular signal route (e.g., a signal routing corresponding to a particular input), to a set of pass transistors (for example, a set of pass transistors in programmable routing, which feed a MUX shared by other sets of pass transistors to save configuration memory bit counts), etc.

Figure 6A:
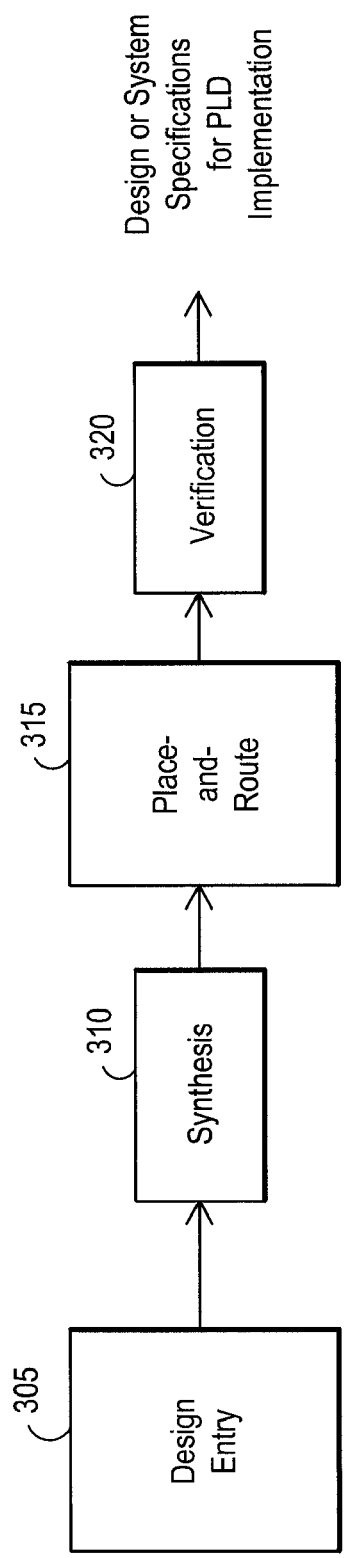
FIG. 6A depicts various software modules that a PLD computer-aided design (CAD) software according to illustrative embodiments of the invention uses.

As noted above, the user may adjust the body bias of various portions of PLDs according to the invention. The user may do so by using the software used to map a design to a PLD. FIG. 6A depicts various software modules that PLD computer-aided design (CAD) software according to illustrative embodiments of the invention uses. The modules include design-entry module 305, synthesis module 310, place-and-route module 315, and verification module 320.

Design-entry module 305 allows the integration of multiple design files. The user may generate the design files by using design-entry module 305 or by using a variety of electronic design automation (EDA) or CAD tools (such as industry-standard EDA tools), as desired. The user may enter the design in a graphic format, a waveform-based format, a schematic format, in a text or binary format, or as a combination of those formats, as desired.

Synthesis module 310 accepts the output of design-entry module 305. Based on the user-provided design, synthesis module 310 generates appropriate logic circuitry that realizes the user-provided design. One or more PLDs (not shown explicitly) implement the synthesized overall design or system. Synthesis module 310 may also generate any glue logic that allows integration and proper operation and interfacing of various modules in the user's designs. For example, synthesis module 310 provides appropriate hardware so that an output of one block properly interfaces with an input of another block. Synthesis module 310 may provide appropriate hardware so as to meet the specifications of each of the modules in the overall design or system.

Furthermore, synthesis module 310 may include algorithms and routines for optimizing the synthesized design. Through optimization, synthesis module 310 seeks to more efficiently use the resources of the one or more PLDs that implement the overall design or system. Synthesis module 310 provides its output to place-and-route module 315.

Place-and-route module 315 uses the designer's timing specifications to perform optimal logic mapping and placement. The logic mapping and placement determine the use of routing resources within the PLD(s). In other words, by use of particular programmable interconnects with the PLD(s) for certain parts of the design, place-and-route module 315 helps optimize the performance of the overall design or system. By proper use of PLD routing resources, place-and-route module 315 helps to meet the critical timing paths of the overall design or system. Place-and-route module 315 optimizes the critical timing paths to help provides timing closure faster in a manner known to persons of ordinary skill in the art with the benefit of the description of the invention. As a result, the overall design or system can achieve faster performance (i.e., operate at a higher clock rate or have higher throughput).

Furthermore, place-and-route module 315 adjusts the body bias of a portion of or all of the PLD(s) that implement the design or system. Place-and-route module 315 may do so automatically, according to user-specified criteria, or a combination of the two. Place-and-route module 315 may use the user-specified criteria (for example, performance specifications, such as power dissipation, speed, and/or current-drive capability). In addition, or instead, place-and-route module 315 may use the information about critical paths within the design or system to adjust body biases of parts or all of the design or system, as desired.

For example, place-and-route module 315 may adjust the body biases of the critical parts of the design or system so as to achieve higher performance. Place-and-route module 315 may take into account power dissipation criteria (e.g., maximum power density) so as to trade off power and performance, as desired. Place-and-route module 315 provides the optimized design to verification module 320.

Verification module 320 performs simulation and verification of the design. The simulation and verification seek in part to verify that the design complies with the user's prescribed specifications. The simulation and verification also aim at detecting and correcting any design problems before prototyping the design. Thus, verification module 320 helps the user to reduce the overall cost and time-to-market of the overall design or system.

Verification module 320 may support and perform a variety of verification and simulation options, as desired. The options may include design-rule checking, functional verification, test-bench generation, static timing analysis, timing simulation, hardware/software simulation, in-system verification, board-level timing analysis, signal integrity analysis and electromagnetic compatibility (EMC), formal netlist verification, and power-consumption estimation, as desired. Note that one may perform other or additional verification techniques as desired and as persons of ordinary skill in the art who have the benefit of the description of the invention understand. As noted above, PLD architecture and circuitry according to the invention provide the ability for the user to trade in a PLD, or regions of a PLD, speed for leakage (and, hence, power dissipation). To make usage of this functionality as convenient as possible for the user, PLD CAD according to exemplary embodiments of the invention can configure the circuitry automatically so as to meet the user's specifications and criteria automatically. Furthermore, to maximize the leakage reduction while minimizing the speed impact on the user's circuit, PLD CAD according to various embodiments of the invention takes the presence of bias regions into account during the implementation of the user circuit, and optimizes the circuit so as to maximize the effectiveness of the bias regions. The following description provides details of the functionality of the PLD CAD.

For a timing-driven PLD CAD system to best exploit substrate-bias, it should estimate the substrate-bias to for the PLD, or each region (which may include one or more transistors) of the PLD, during design implementation. The PLD CAD takes into account the body bias during timing analysis of the design. Thus, the body-bias levels affect which portions of the design become critical from a timing point of view.

Initially, the CAD system assumes some body-bias level (and, hence, leakage/speed setting) for each region in the PLD for which the user wishes to set or program the body-bias level(s) of one or more transistors. As one possible choice, the PLD CAD may assume that all affected regions will use a relatively low speed setting (i.e., a body bias that results in relatively low leakage levels). The PLD CAD system provides an initial placement of the PLD circuitry. Placement proceeds via iterative improvements of that initial placement.

At various points during this iterative improvement procedure, the PLD CAD estimates the speed of the circuit, and calculates timing slack values for all connections involved. The calculation of timing slack values takes into account the current body-bias level selected for each region when estimating delays. Note that the PLD CAD interleaves body-bias selection with iterative improvements of placement. The PLD CAD evaluates regions that contain portions of the circuit with smaller average and worst-case connection slack values for conversion to a higher-speed (and corresponding higher leakage) body-bias setting. The CAD software selects a new candidate bias setting for one or more regions, and evaluates the bias setting by estimating the total cost of the new setting in terms of circuit timing, and the total increase in leakage current and/or power. If the new bias setting leads to positive slack values for all connections in the region (or less-negative slack levels in the region), the PLD CAD generally adopts the new bias setting.

Similarly, the CAD software evaluates for conversion to a lower-speed body-bias setting those regions that currently have relative high bias settings, but in which all connections have positive slack values. The CAD software adopts the new body-bias setting if doing so would not cause a violation of any circuit timing criterion or criteria.

Upon changing one or more bias setting(s), iterative placement improvement continues to try to resolve any potential timing concerns or violations generated by the changed bias setting, or it tries moving more time-critical circuitry into newly created bias regions with higher speed. The algorithm terminates either when the placement and routing meets the user's timing and power goals, or when it reaches a desired or prescribed iteration limit (i.e., it appears that it cannot accomplish any no further improvement).

Figure 6B:
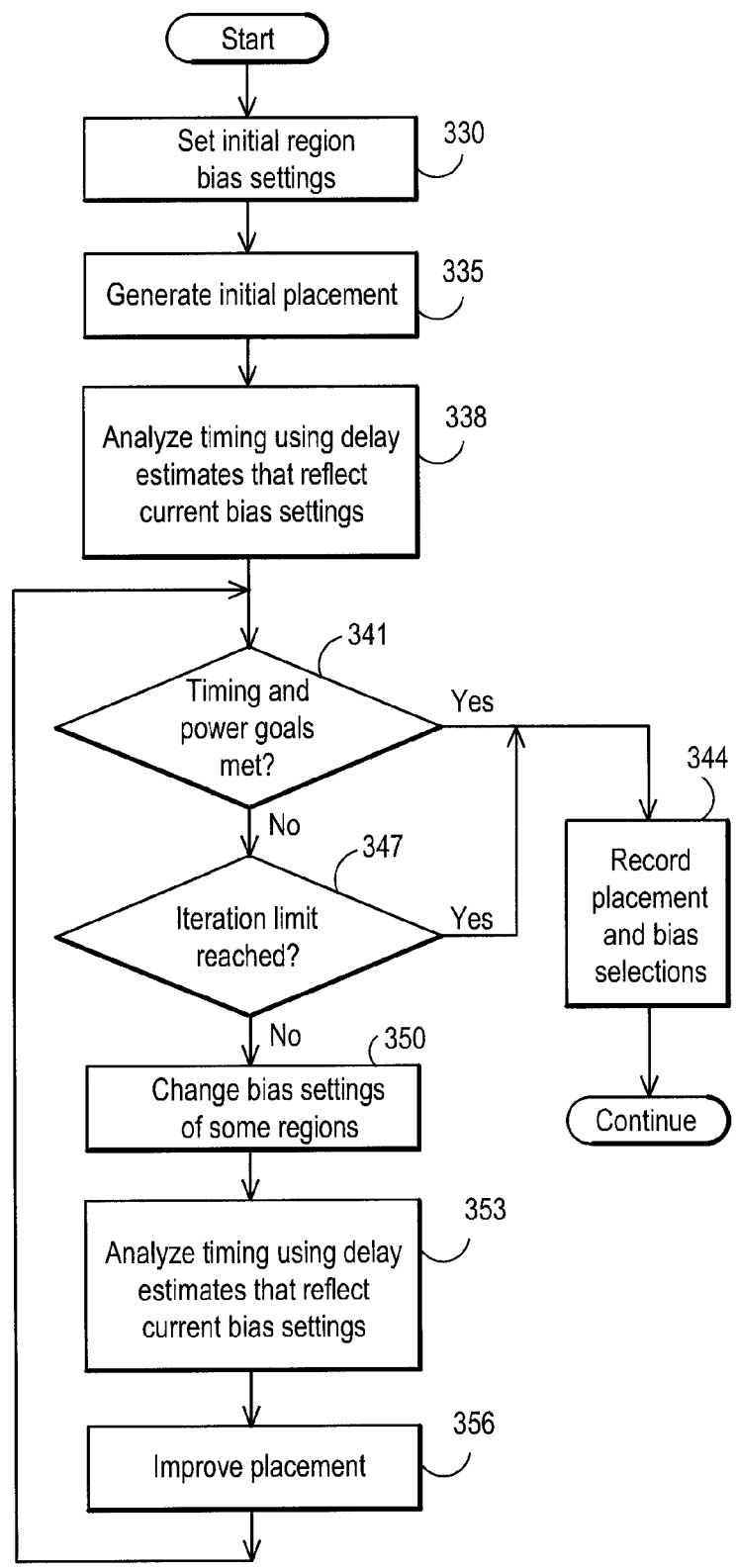
FIG. 6B illustrates a flow diagram for a PLD CAD software according to an exemplary embodiment of the invention.

FIG. 6B illustrates a flow diagram for a PLD CAD software according to an exemplary embodiment of the invention. The PLD CAD shown in FIG. 6B incorporates the choice of body bias for each region of the PLD into a timing-driven place-and-route CAD system.

More specifically, at 330, the PLD CAD sets initial region body-bias setting(s). At 335, the software generates an initial placement. Then, at 338, it analyzes the timing of the circuitry using delay estimates that reflect present body-bias settings. At 341, the software determines whether it has met the user's timing and power goals. If so, at 344 it records the placement and body-bias selections. If not, the software checks at 347 to determine whether it has reached the iteration limit. If so, it proceeds to 344 to record the current placement and body-bias selections. If the software has not reached the iteration limit, it increments the iteration count (not shown explicitly), and at 350 changes the bias settings of at least some regions. At 353, it analyzes the timing of the circuitry using delay estimates that reflect the changed body-bias settings. At 356, it improves the placement of the circuit, and jumps to 341 to determine whether it has met the user's timing and power goals.

As persons of ordinary skill in the art who have the benefit of the description of the invention understand, one may use many variations of the algorithms described here. For example, one may use a variety of initial body-bias settings, such as setting all regions to low speed, or to high speed. If the software estimates that it will meet all timing specifications in a placement, it may evaluate converting high-speed bias regions to low-speed regions, with preference given to regions containing connections with larger positive slack values. After converting some regions into low-speed regions, the software resume placement improvement. The software may iterate those two steps until it meets the user's power and timing goals.

As a second example, the software may generate an initial setting of bias regions from a user's chip floor-plan. The software initially sets the bias for the time-critical regions in the floor-plan for high speed of operation, and sets the bias for other regions for relatively low speed of operation. The software may then use the technique shown in FIG. 6B for further improvement in bias selection.

As a third example, the software may generate an initial setting of body bias from a quick placement of the circuit, followed by a timing analysis, to distinguish speed-critical regions from other regions. The placement may constitute a normal placement, or may constitute a "coarse placement" that determines in which body-bias region to locate each part of the user's circuit. The software may then use the algorithm in FIG. 6B for further improvement of those initial bias settings.

As a fourth example, before beginning placement, the software may pre-cluster the circuit into relatively large circuit elements that constitute a body-bias region. Each of the clusters may consist of circuitry that is either time-critical or non-time-critical. The software may place the clusters on a coarse grid that represents the PLD's body-bias regions. The software may then set the bias level of each region according to the type of circuitry placed in it. Thus, time-critical circuits receive a relatively high-speed body-bias setting, whereas non-time-critical circuits receive a relatively low-speed. The software may then use the algorithm in FIG. 6B with those initial bias settings to improve the placement.

As a fifth example, other algorithms besides placement algorithms, such as routing algorithms, may take into account the body-bias of a given region in their delay estimation. One may interleave such algorithms with body-region bias fine-tuning by interleaving region body-bias selection and normal algorithm optimization.

Once the PLD CAD has implemented a design (i.e., synthesized, placed and routed the design), the CAD software should automatically set the body-bias circuitry (e.g., body-bias generation circuitry, body-bias control circuitry) to the correct state and body-bias level(s). The software may do so in several ways, depending on the details of the body-bias circuitry works, and also on user's goals.

As one alternative, if the user has a leakage power goal, and the bias circuitry incorporates leakage-locked loops (described below in detail), the PLD CAD should set the bias circuitry to so that the leakage power is less than or equal to the user's power-dissipation goal. The CAD software may then analyze the timing of the circuit at relatively high temperatures and the process corner with the highest ratio of leakage current to "ON" transistor drive current so that the circuit meets all timing specifications at that process and operating condition. If the user instead has the goal of minimizing leakage power, subject to meeting all timing specifications, the software may set the leakage-locked loop in each region such that the transistors operate in a regime where they meet all timing constraints at the worst expected process and operating corner. Generally, the corner will occur at relatively high temperatures and at the process corner with the highest ratio of leakage current to "ON" transistor drive current.

As another alternative, if the user has the goal of minimizing power subject to meeting some timing specifications and the bias circuitry includes delay-locked loops, the CAD software may set or program the delay loops so that that the circuit meets those timing specifications. The software may do so by extracting the most critical path from the circuitry in each body-bias region via timing analysis. If the delay-locked loop uses a programmable delay chain, the software sets the circuitry such that it sets the delay of the reference chain in each body-bias region to a nominal delay value greater than the nominal delay of the corresponding body-bias region's critical path. The software routes to the delay-locked circuitry the appropriate clock signal(s) that define the launch and capture edges for the critical path. Usually the same clock signal defines both the launch and capture edges, but in designs with multiple phase and frequency-related clock signal(s), separate clock domains may define the launch and capture edges. If the delay-locked loop is "soft" and locks to some PLD circuitry, the CAD system should make as precise a copy of each critical path for each bias region as possible to be used as reference delay of the delay-locked loop.

As yet another alternative, the PLD CAD may give the user the ability to select between various power-delay trade-offs by programming the body-bias circuitry. In that case, the CAD software looks up the appropriate power and delay models according to the bias setting the user has chosen, and uses those models in power and timing analysis. The software may make the power and delay models less conservative (worst-case). One may do so by testing the devices before shipment to users, and storing data (generally, in the form of the threshold voltage) indicating the transistor speed and leakage in the PLD (for example, in non-volatile memory that resides within the PLD). The CAD software still programs the user's desired power-delay trade-off into the device during programming, but on-chip hardware compares this "desired"

trade-off with the stored device characteristics, and computes and applies the appropriate body bias levels so that the transistors have the desired power-delay trade-off.

Figure 7:
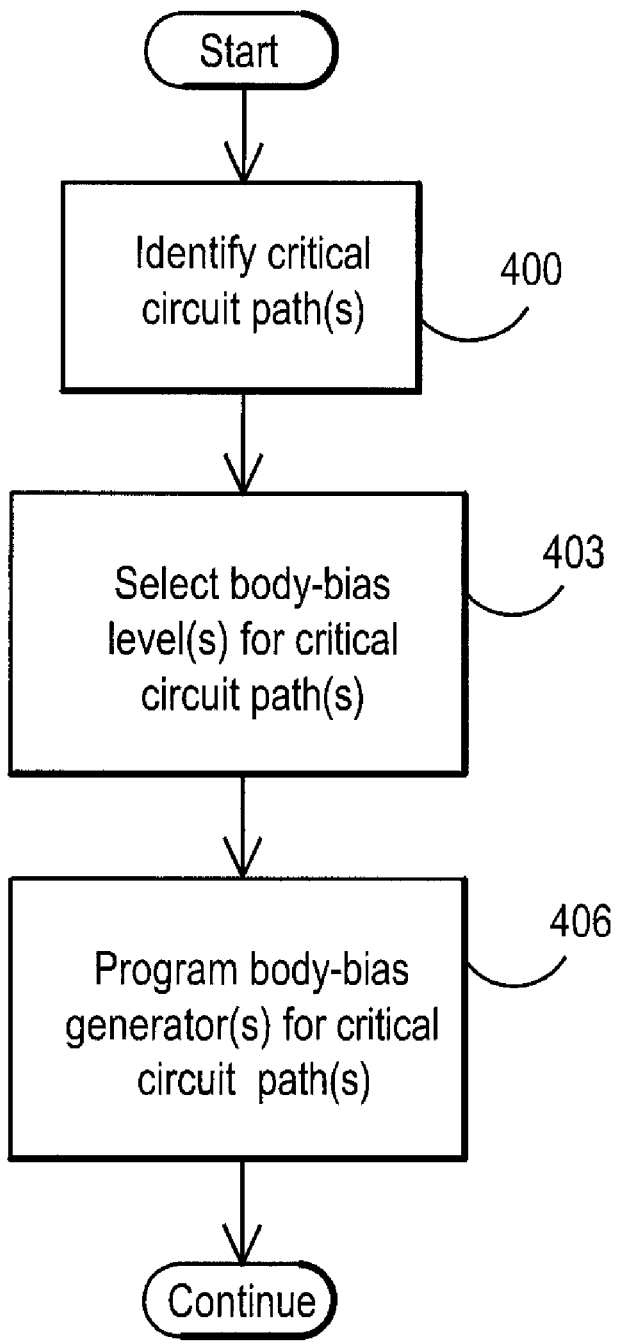
FIG. 7 shows a flow diagram for the process of adjusting body bias according to an exemplary embodiment of the invention.

FIG. 7 shows a flow diagram for the process of adjusting body bias according to an exemplary embodiment of the invention. A program, such as the software described in conjunction with FIG. 6A, may perform the process in FIG. 7.

Once the process begins, at 403, it identifies critical circuit path(s) within the PLD that implements the design or system, as described above, and as persons of ordinary skill in the art who have the benefit of the description of the invention understand. At 403, the process adjusts the body bias of transistors within the identified critical circuit path(s). In other words, it select one or more body-bias levels for one or more transistor or sets of transistors. Next, at 406, the process programs or configures one or more body-bias generators for the critical circuit path(s). The body-bias generator(s) generate one or more body-bias levels selected at 403.

Note that the process need not confine itself to merely the identified critical circuit paths or blocks. Instead, or in addition, the user may identify and specify circuit paths or blocks that the user desired to meet specific performance criteria. For example, the user may wish to have a high-speed adder implemented within the PLD. The user may identify the circuitry or blocks used to implement the adder and specify to the software to adjust the body-bias level(s) of the circuitry or blocks to meet certain timing specifications. The user may provide other performance specifications or criteria, such as power dissipation. The software may trade off the various performance specifications to select the body-bias level(s) of the circuit path(s) or blocks.

Figure 8:
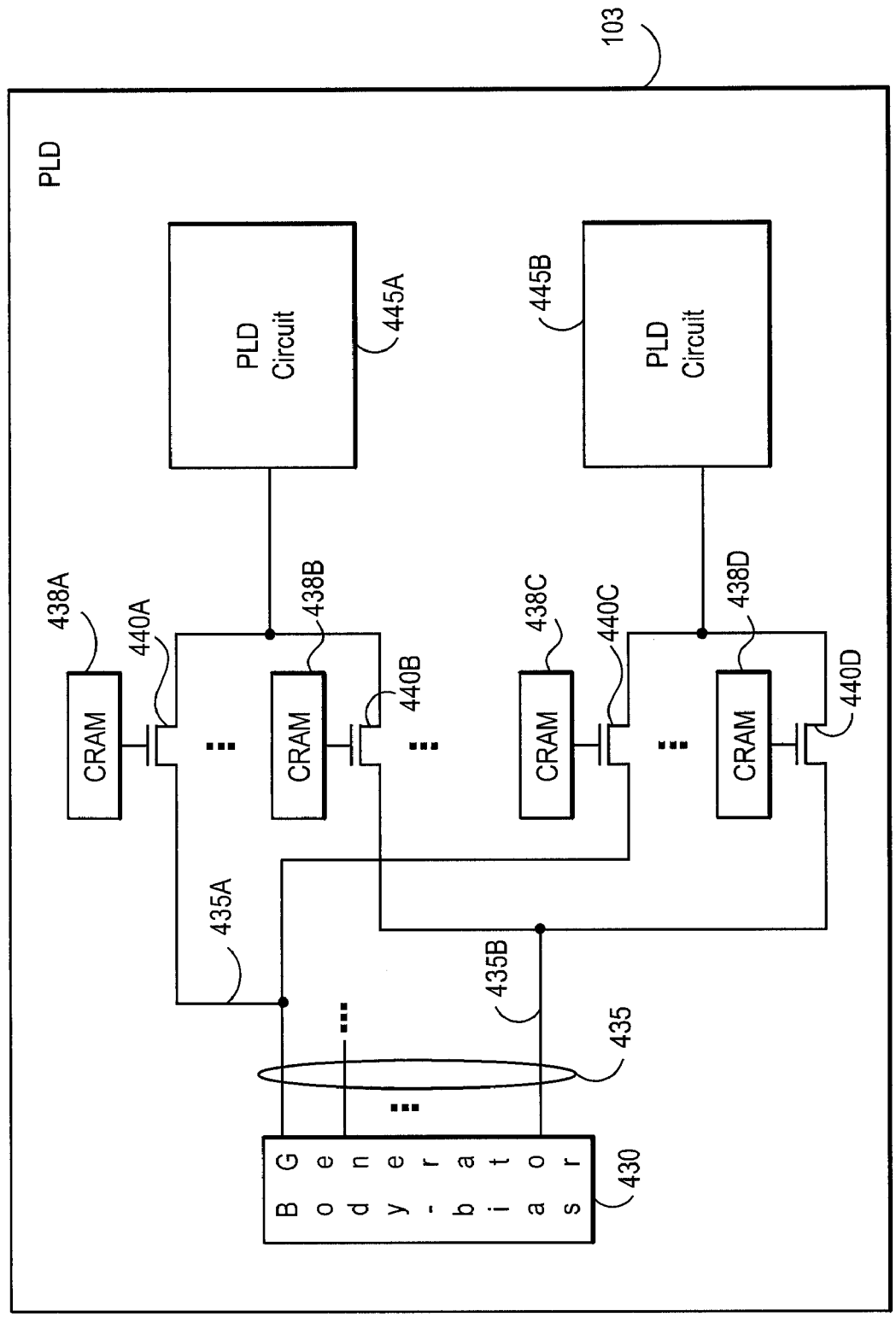
FIG. 8 illustrates a block diagram of circuitry within a PLD according to exemplary embodiments of the invention to adjust, program, or set the body-bias levels of desired PLD circuitry or blocks.

FIG. 8 shows a block diagram of circuitry within a PLD according to exemplary embodiments of the invention to adjust, program, or set the body-bias levels of desired PLD circuitry or blocks. The circuitry includes body-bias generator 430, a plurality of configuration memory (configuration random-access memory, or CRAM, or other implementations of the memory) cells 438A-438D, a plurality of transistors 440A-440D, and PLD circuits 445A-445B.

Body-bias generator 430 generates one or more body-bias signals 435 and provides those signal(s) to transistors 440A-440D. In response to a respective one of the data in CRAM cells 438A-438, transistors 440A-440D provide the body-bias signals 435 to PLD circuits 445A-445B. PLD circuits 445A-445B may constitute circuitry whose body-bias levels one wishes to set, program, or adjust, such as individual transistors, groups of transistors, circuit blocks, etc., as described above.

For example, suppose that CRAM cells 438A and 438C store binary ones, whereas CRAM cells 438B and 438D store binary zeros. Consequently, transistors 440A and 440C turn ON and provide body-bias signal 435A to PLD circuits 445A-445B. Transistors 440B and 440D turn OFF, and therefore do not provide any signals to PLD circuits 445A-445B.

As another example, suppose that the reverse situation of the preceding example exists (i.e., CRAM cells 438A-438D hold binary data 0, 1, 0, 1, respectively). In this case, transistors 440A and 440C turn OFF (and thus provide no signals to PLD circuits 445A-445B), and transistors 440B and 440D turn ON. As a result, transistors 440B and 440D provide body-bias signal 435B to PLD circuits 445A-445D.

In exemplary embodiments, CRAM cells 438A-438D may serve more than one purpose, as desired. More specifically, CRAM cells 438A-438D may control the body bias of various circuitry within the PLD (e.g., PLD circuit 445A or 445B). In addition, CRAM cells 438A-438D may serve as routing CRAM cells. In other words, in addition to controlling body bias levels, one or more of CRAM cells 438A-438D may select one circuit path over another circuit path within a MUX (i.e., select one routing path within a MUX as opposed to an alternative routing path within the MUX), as desired.

Note that one may implement body-bias generator 430 in a variety of ways, as persons of ordinary skill in the art with the benefit of the description of the invention understand. For example, one may use a bias source (e.g., one of a variety of well-known bias sources) and then use a charge pump to generate body-bias signals 435, which are pumped to appropriate or desired levels. As another example, one may use stored digital data corresponding to body-bias levels and use one or more scaler circuits together with one or more digital-to-analog converters (DACs) to generate the desired body-bias signals 435.

In addition to adjusting, programming, or setting body-bias levels, one may use other measures to control the power dissipation and, hence, power density of PLDs. More specifically, one may selectively shut down or turn off portion(s) of the circuitry within a PLD. As a result, one may further reduce the power dissipation within the PLD.

Figure 9:
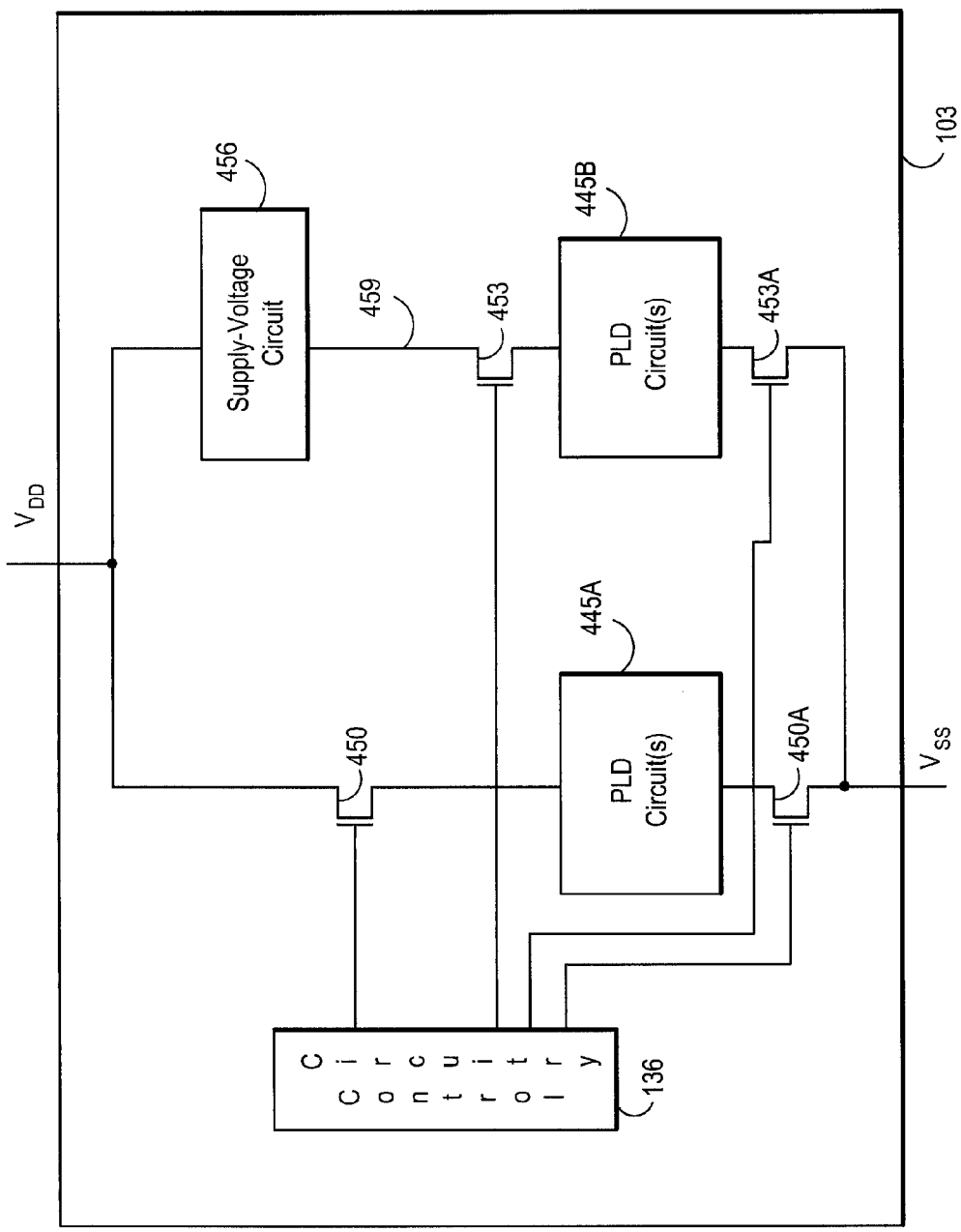
FIG. 9 depicts a block diagram of a circuit for selectively turning off circuitry or reducing or generally controlling power consumption of circuitry within a PLD according to exemplary embodiments of the invention.

FIG. 9 shows a block diagram of a circuit for selectively turning off circuitry or reducing or generally controlling power consumption of circuitry within a PLD according to exemplary embodiments of the invention. The circuit includes control circuitry 136, transistor 450, and PLD circuit(s) 445A. In addition, the circuit may include transistor 450A, transistor 453, supply-voltage circuit 456, transistor 453A, and PLD circuit(s) 445B.

Suppose that one wishes to shut down PLD circuit(s) 445A. Transistor 450 couples PLD circuit 445A to the supply voltage $V_{DD}$. In other words, when transistor 450 is ON, PLD circuit(s) 445A receive(s) the supply voltage $V_{DD}$, and vice-versa. Transistor 450 turns ON and OFF in response to a control signal from control circuitry 136. Thus, to turn off PLD circuit(s) 445A, one causes control circuitry 136 to de-assert the gate signal of transistor 450 and interrupt the supply voltage to PLD circuit(s) 445A. One may subsequently turn ON PLD circuit(s) 445A by asserting the gate signal of transistor 450 under the supervision of control circuitry 136.

Note that, rather than turning transistor 450 OFF or ON, one may control the gate voltage of transistor 450 so as to use transistor 450 as a variable impedance device. Thus, transistor 450 may at extremes have relatively high impedance (OFF state), relatively low impedance (ON state), or an impedance level between those two states. As a result, one may not only turn OFF and ON PLD circuit(s) 445A, but also control power dissipation within those circuit(s) by controlling the impedance of transistor 450.

In addition to, or instead of, using transistor 450 to control the provision of supply voltage, $V_{DD}$, to PLD circuit(s) 445A (whether turning OFF, ON, or anything in between those extremes, as described above), one may use transistor 450A to control the provision of supply voltage $V_{SS}$ (typically circuit ground). The details of operation are similar to those described above with respect to transistor 450 and supply voltage $V_{DD}$, as persons of ordinary skill in the art who have the benefit of the description of the invention understand.

PLD 103 may use more than one supply voltage, as desired. In other words, one may optionally use supply-voltage circuit 456 to generate secondary supply-voltage 459 from the primary supply voltage, $V_{DD}$. Secondary supply-voltage 459 may have a smaller or larger magnitude than the primary supply voltage, as desired. Furthermore, one may use more than one secondary supply-voltage, as desired. Secondary supply-voltage 445B powers PLD circuit 445B. One may shut down or power up PLD circuit(s) 445B by, respectively, de-asserting and asserting the gate signal of transistor 453 under the supervision of control circuitry 136.

Note that, rather than turning transistor 453 OFF or ON, one may control the gate voltage of transistor 453 so as to use it as a variable impedance device. Thus, transistor 453 may at extremes have relatively high impedance (OFF state), relatively low impedance (ON state), or an impedance level between those two states. As a result, one may not only turn OFF and ON PLD circuit(s) 445B, but also control power dissipation within those circuit(s) by controlling the impedance of transistor 453.

In addition to, or instead of, using transistor 453 to control the provision of secondary supply voltage 459 to PLD circuit(s) 445B (whether turning OFF, ON, or anything in between those extremes, as described above), one may use transistor 453A to control the provision of supply voltage $V_{SS}$ (typically circuit ground). The details of operation are similar to those described above with respect to transistor 453 and secondary supply-voltage 459, as persons of ordinary skill in the art who have the benefit of the description of the invention understand.

Note that each PLD circuit 445A and/or PLD circuit 445B may constitute a PLD block (see, for example, FIGS. 1, 3, and 4), a portion of a PLD block, or a set of PLD blocks, as desired. In other words, one may selectively apply the power control techniques to one or more blocks, sub-blocks, or portions of block(s) within a PLD, as desired.

Figure 10:
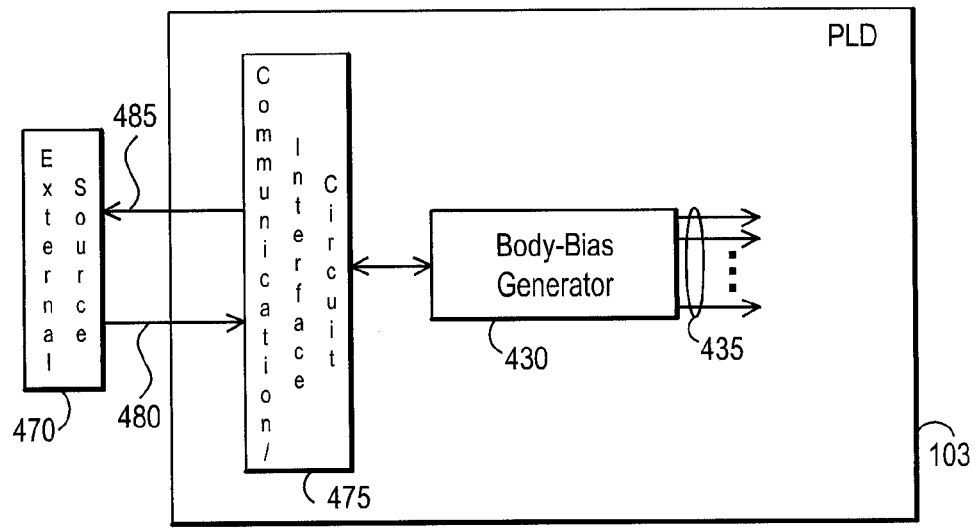
FIG. 10 shows a circuit arrangement according to exemplary embodiments of the invention for adjusting body-bias levels within a PLD in response to an external source.

Note that one may adjust, program, or set body-bias levels in response to sources external to the PLD. For example, one may communicate body-bias levels to a PLD to adjust or modify its performance. FIG. 10 shows a circuit arrangement according to exemplary embodiments of the invention for adjusting body-bias levels within a PLD in response to an external source 470. The circuit arrangement includes external source 470, communication/interface circuit 475, and body-bias generator 430.

Communication/interface circuit 475 provides a mechanism for external source 470 and body-bias generator 430 to communicate and exchange information. External source 470 may provide one or more control signal(s) 480 to communication/interface circuit 475 within PLD 103. Communication/interface circuit 475 provides the information received from external source 470 to body-bias generator 430. In response, body-bias generator 430 generates one or more body-bias signals 435, with levels corresponding to control signal(s) 480. Communication/interface circuit 475 may provide information, such as status signals, from body-bias generator 430 (or PLD 103 generally) to external source 470.

External source 470 may constitute a variety of devices, structures, or arrangements, as persons of ordinary skill in the art with the benefit of the description of the invention understand. For example, external source 470 may constitute the Internet, a computer network, a bus, etc., as desired.

Note that one may adjust, program, or set the body-bias levels in PLDs on a dynamic or time-varying basis, as desired, to take into account or respond to changing conditions (for example, changes in performance specifications). As one example, referring to FIG. 10, external source 470 may update or modify control signal(s) 480 that it provides to PLD 103. In response, body-bias generator 430 provides body-bias signals 435 that correspond to the updated or modified control signal(s) 480.

Figure 11:
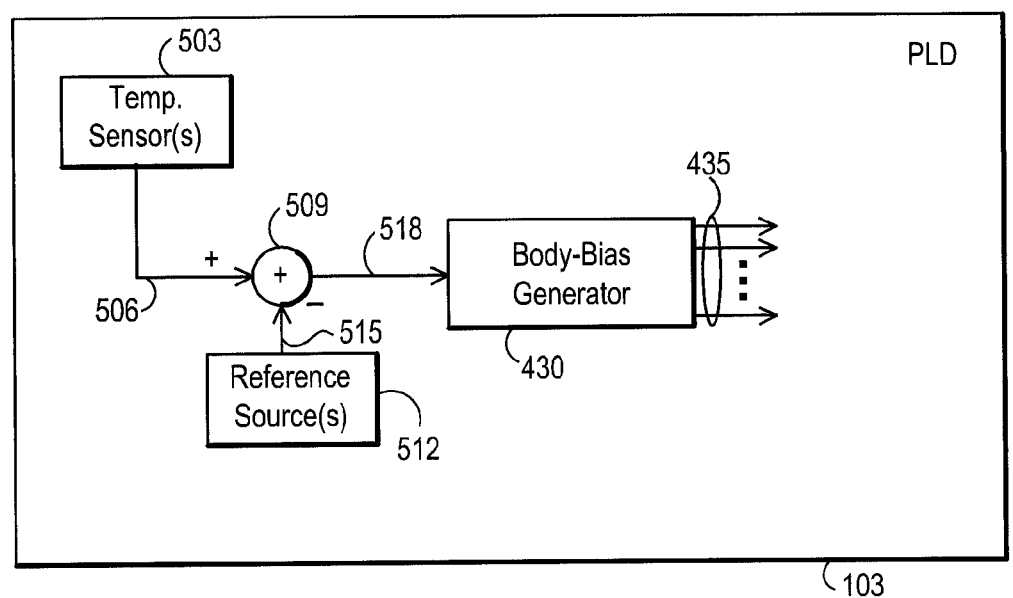
FIG. 11 illustrates a circuit arrangement for modifying body-bias level(s) within a PLD according to exemplary embodiments of the invention.

As another example, one may change or adjust body-bias levels in response to changes within PLD 103 itself, for instance, a change in temperature in one or more circuits or areas of PLD 103. FIG. 11 shows a circuit arrangement for modifying body-bias level(s) within a PLD according to exemplary embodiments of the invention.

The circuit arrangement includes one or more temperature sensor(s) 503, one or more reference source(s) 512, subtracter 509, and body-bias generator 430. Temperature sensor(s) 503 sense the temperature in one or more areas, circuits, or blocks within PLD 103 and provide temperature signal(s) 506 to subtracter 509. Reference source(s) 512 provide reference signal(s) 515 to subtracter 509. Reference signal(s) 515 may have values that correspond to various temperature levels.

Subtracter 509 subtracts reference signal(s) 515 from temperature signal(s) 506 and provides difference signal(s) 518 to body-bias generator 430. Difference signal(s) 518 may constitute the difference between actual temperatures and desired temperatures in one or more parts of PLD 103.

In response to difference signal(s) 518, body-bias generator 430 generates body-bias signal(s) 435. Body-bias generator 430 may use difference signal(s) 518 to generate body-bias signal(s) 435 that affect various aspects of the performance of PLD 103. For example, if difference signal(s) 518 indicate a lower temperate than a threshold or maximum temperature, body-bias generator 430 may generate body-bias signal(s) that decrease the threshold voltage of one or more transistors within PLD 103 (and hence cause increased performance). In contrast, if difference signal(s) 518 indicate a temperature level higher than a safe or maximum level, body-bias generator 430 may generate body-bias signal(s) that increase the threshold voltage of one or more transistors within PLD 103 (thus causing decreased temperature levels, albeit decreased performance).

More generally, one may implement a feedback loop that generates body-bias level(s) so as to target specific performance criteria. Put another way, one may compare actual performance measures of a PLD to desired or specified measures or criteria and adjust, program, or set body-bias levels accordingly.

Figure 12:
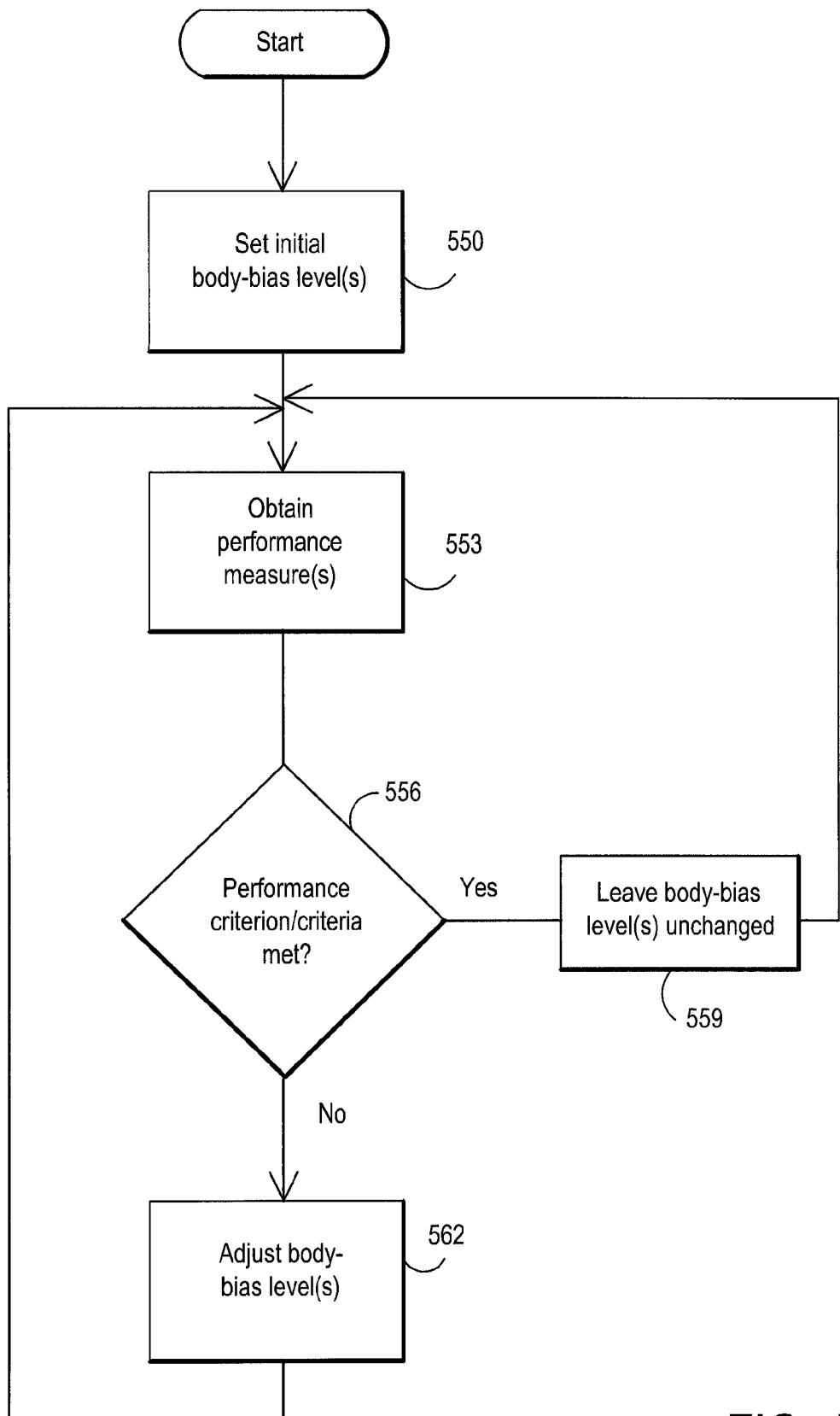
FIG. 12 depicts a flow diagram for a process or technique of adjusting, programming, or setting body-bias levels in a PLD used in exemplary embodiments of the invention.

FIG. 12 shows a flow diagram for a process or technique of adjusting, programming, or setting body-bias levels in a PLD used in exemplary embodiments of the invention. One may implement the process or technique by using appropriate circuitry (or a combination of circuitry and software or firmware), such as control circuitry 136.

The process operates as follows. At 550, one sets or programs initial body-bias level(s) for desired portion or portions of the PLD. Subsequently, at 553, one obtains performance measure(s) of the PLD. The performance measures may include a wide variety of criteria, such as the time a given operation takes, power consumption, power density, throughput, on-chip self test results, and the like, as persons of ordinary skill in the art who have the benefit of the description of the invention understand.

Next, at 556, the process checks to determine whether the actual performance measure(s) meet the desired or specified criterion or criteria. If so, at 559, the process leaves the body-bias level(s) unchanged. On the other hand, if the actual performance measure(s) fail to meet the specified criterion or criteria, at 562 the process adjusts, programs, or sets new or updated body-bias levels so as to reduce the difference between the actual and desired performance measure(s). The process then returns to 553 to check whether the effect of the new body-bias level(s) on the actual performance measure(s). The process may continue indefinitely or a given number of times, as desired.

Figure 13:
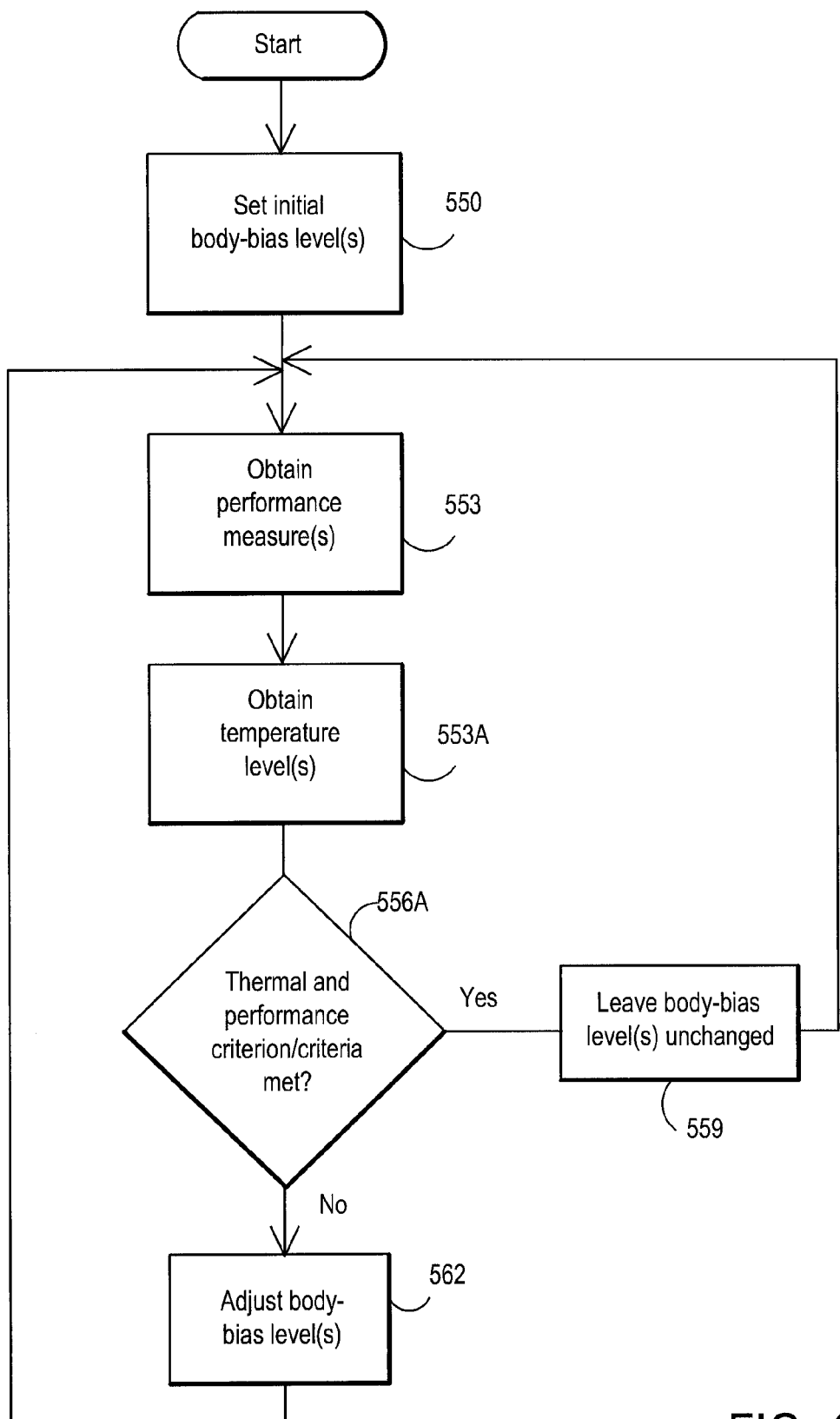
FIG. 13 shows a flow diagram for a process or technique of adjusting, programming, or setting body-bias level(s) that takes temperature level(s) into account.

In addition to checking performance measures (e.g., speed of operation, throughput, power consumption), one may check temperature level(s) of one or more parts or circuits within the PLD. FIG. 13 shows a flow diagram for a process or technique of adjusting, programming, or setting body-bias level(s) that takes temperature level(s) into account. As noted above, one may implement the process or technique by using appropriate circuitry (or a combination of circuitry and software or firmware), such as control circuitry 136.

At 550, the process sets, programs, or adjusts the initial body-bias level(s) for desired transistors, circuits, blocks, and the like, within the PLD. At 553, it obtains performance measures. The performance measures may include a wide variety of parameters or variables, as noted above. The choice of performance measures depends on factors such as design and performance specifications for the circuit or system that the PLD implements, as persons of ordinary skill in the art understand.

Subsequently, a 553A, the process obtains temperature level(s). As noted above, one may obtain and check one ore more temperature levels from various parts of the PLD. In exemplary embodiments, one may obtain temperature level(s) from any identified critical path(s) or, in general, any circuitry that may have relatively high power consumption and, hence, relatively high temperature levels.

At 556A, the process checks to determine whether the actual performance measure(s) meet the desired or specified criterion or criteria. Furthermore, the process checks to determine whether the actual temperature level(s) meet the desired or specified criterion or criteria (e.g., whether the actual temperature falls within a prescribed range or below a threshold level, etc.).

If both conditions hold, at 559, the process leaves the body-bias level(s) unchanged. If both conditions fail to hold, however, at 562 the process adjusts, programs, or sets new or updated body-bias levels so as to reduce the difference between the actual and desired performance measure(s) and between the actual and desired or prescribed temperature level(s). The process then returns to 553 to check whether the effect of the new body-bias level(s) on the actual performance measure(s) and on the temperature level(s). The process may continue indefinitely or a given number of times, as desired.

In other embodiments, one may adjust, program, or set the body-bias level(s) in response to or depending on the operating environment of the circuit or system that the PLD implements. For example, suppose that one uses a PLD according to the invention to realize a communications network controller or router. During operation, the PLD may obtain information about the conditions or characteristics of the environment in which the controller or router operates.

For instance, the PLD may obtain measures relating to the traffic levels within that environment. Depending on the conditions in, or characteristics of, its operating environment, the PLD may adjust, program, or set body-bias level(s) in one or more of its transistors so that its performance matches the needs of the operating environment. Of course, the example above constitutes merely one illustration of how one may use such PLDs. One may apply the inventive concepts to a wide variety of circuits, systems, and operating environments, each with their own characteristics and conditions, as persons of ordinary skill in the art who have the benefit of the description of the invention understand.

Figure 14:
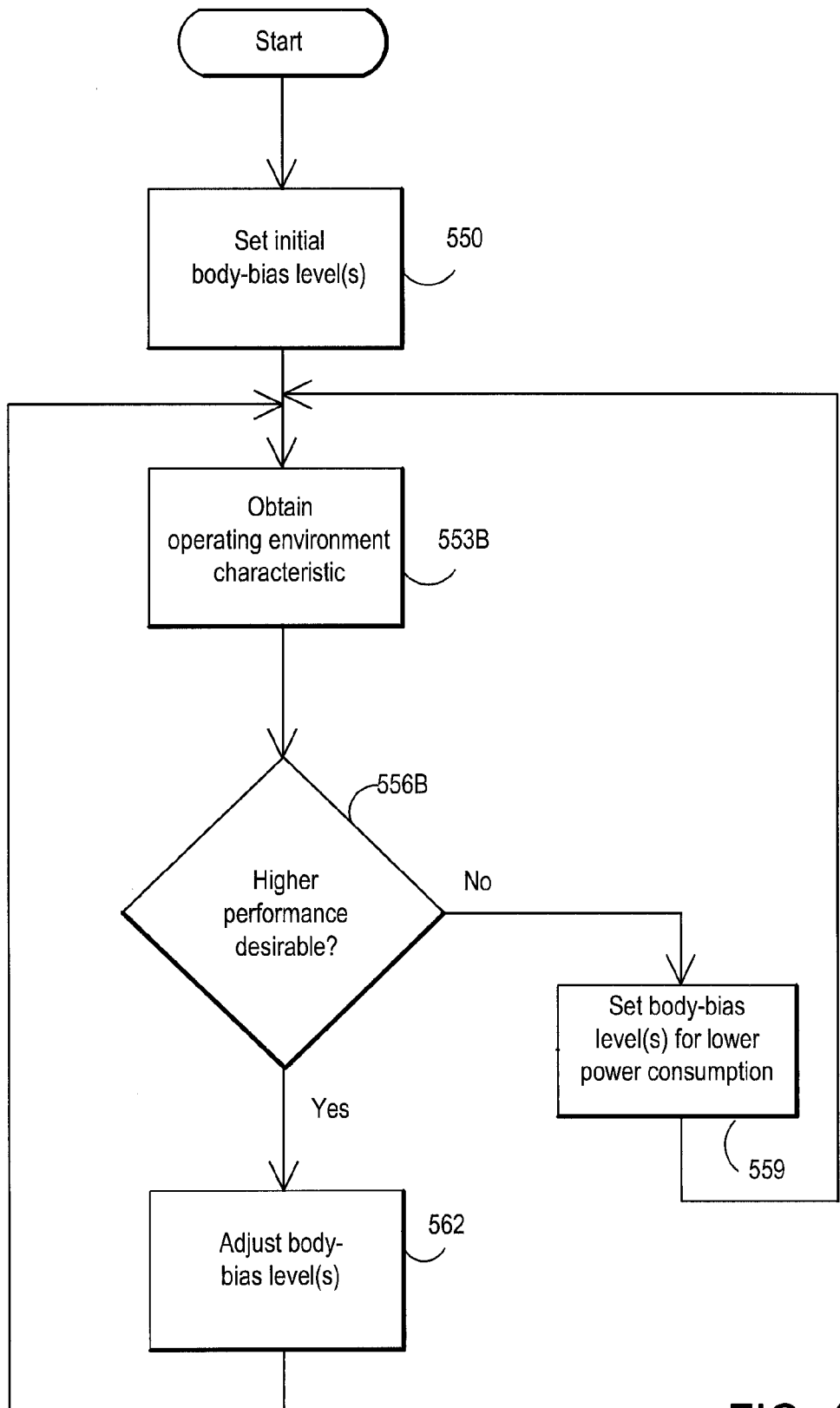
FIG. 14 illustrates a flow diagram for a process or technique of adjusting, programming, or setting body-bias level(s) that takes into account the characteristics of the environment in which the PLD operates.

FIG. 14 shows a flow diagram for a process or technique of adjusting, programming, or setting body-bias level(s) that takes into account the characteristics or conditions of the environment in which the PLD operates. As noted above, one may implement the process or technique by using appropriate circuitry (or a combination of circuitry and software or firmware), such as control circuitry 136.

The process operates as follows. At 550, one programs or sets initial body-bias level(s) for desired portion or portions of the PLD. Subsequently, at 553B, one obtains one or more conditions or characteristics of the environment, circuit, or system in which the PLD operates. The conditions or characteristics may include a wide variety of items, as noted above.

Next, at 556B, the process checks to determine whether the conditions or characteristics of the operating environment make desirable higher performance levels of the PLD. (To use the example above, for instance, whether network traffic levels are relatively high, thus making higher PLD performance or throughput more desirable.) If not, at 559, the process leaves the body-bias level(s) unchanged. On the other hand, if higher PLD performance or throughput are desirable, at 562 the process adjusts, programs, or sets new or updated body-bias levels so as to reduce the difference between the actual and desired performance measure(s). The process then returns to 553B to check whether the effect of the new body-bias level(s) on the actual performance measure(s). The process may continue indefinitely or a given number of times, as desired.

One may use a variety of embodiments according to the inventive concepts, depending on factors such as design and performance specifications for a given application or implementation. For example, referring to FIG. 14, note that, similar to the embodiment described in connection with FIG. 13, one may take into account temperature level(s) of various parts of the PLD, as desired.

Figure 15:
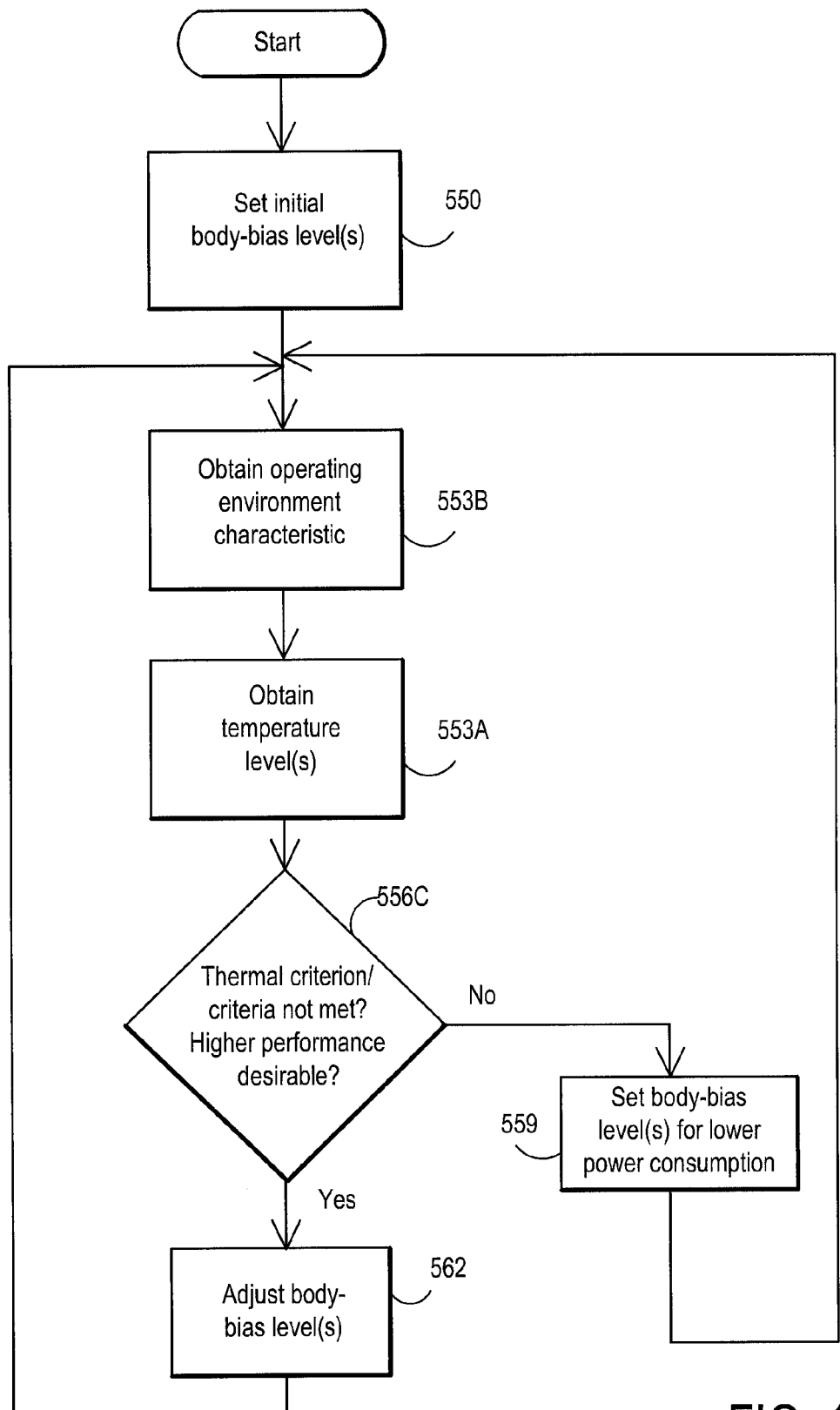
FIG. 15 depicts a flow diagram for a process or technique of adjusting, programming, or setting body-bias level(s) that takes into account temperature level(s) and the characteristics of the environment in which the PLD operates.

Put another way, one may examine not only the desirability of higher PLD performance or throughput, but also whether temperature level(s) or power densities within the PLD make increased PLD performance safe or appropriate. FIG. 15 shows a process for realizing such an embodiment. One may repeat the procedure a desired number of times, depending on the application. As noted above, one may implement the process or technique by using appropriate circuitry (or a combination of circuitry and software or firmware), such as control circuitry 136.

Figure 16:
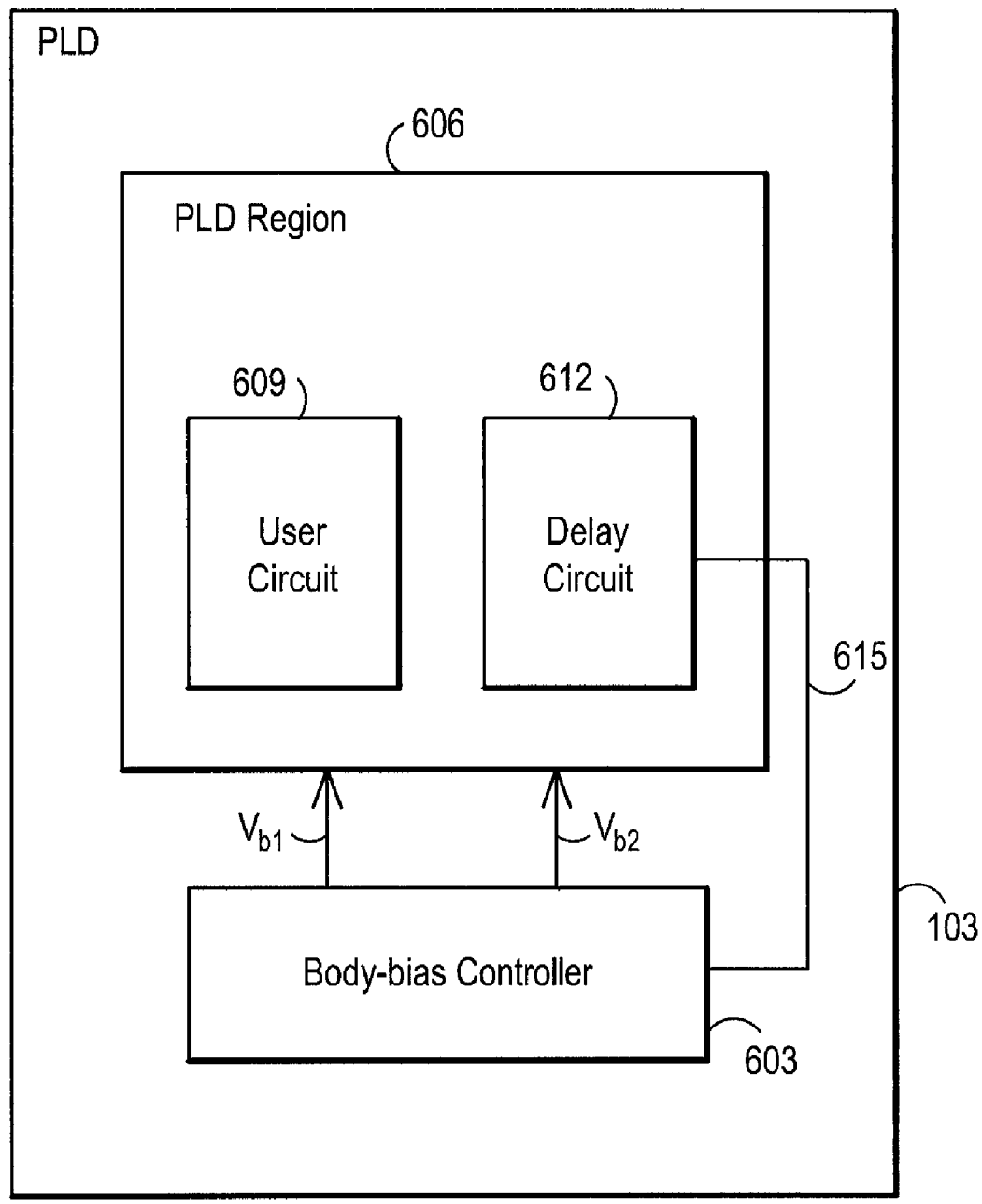
FIG. 16 shows a circuit arrangement for adjusting the body bias of transistors in a user circuit based on a delay representative of the operating delay of the user circuit.

Another aspect of the disclosure relates to setting or adjusting the body bias of circuitry within a PLD by measuring the delay of a selected circuit or region within the PLD. FIG. 16 shows a circuit arrangement for adjusting the body bias of transistors in a user circuit based on a delay representative of the operating delay of the user circuit. More specifically, the circuit arrangement includes PLD 103, PLD region 606, user circuit 609, delay circuit 612, and body-bias controller 603.

PLD region 606 includes user circuit 609 and delay circuit 612. User circuit 609 may include any desired circuitry, such as a user-implemented or designated circuit or a portion of it (for example, the critical path). Delay circuit 612 represents or models the actual delay of user circuit 609. Generally, the delay represents the delay of user circuit 609, and it need not have the same delay as user circuit 609. For example, delay circuit 612 may have the same delay as user circuit 609, twice as much delay, half as much delay, etc., as desired.

Delay circuit 612 couples to body-bias controller 603 via signal link 615 (one or more coupling mechanisms, such as conductors). In response to the actual delay of delay circuit 612, body-bias controller 603 provides one or more body-bias signals to at least some transistors in PLD region 606 (as described below in detail).

Note that FIG. 16 shows two body-bias signals, $V_{b1}$ and $V_{b2}$. The body-bias signal(s) adjust or set the body-bias of at least one transistor in PLD region 606. For example, one body-bias signal (say, $V_{b1}$) may set the body bias of PMOS transistors, whereas another body-bias signal (say, $V_{b2}$) may set the body bias of NMOS transistors, etc. By adjusting the body bias of transistors in user circuit 609, one may control or adjust its speed and leakage, as described above.

Figure 17:
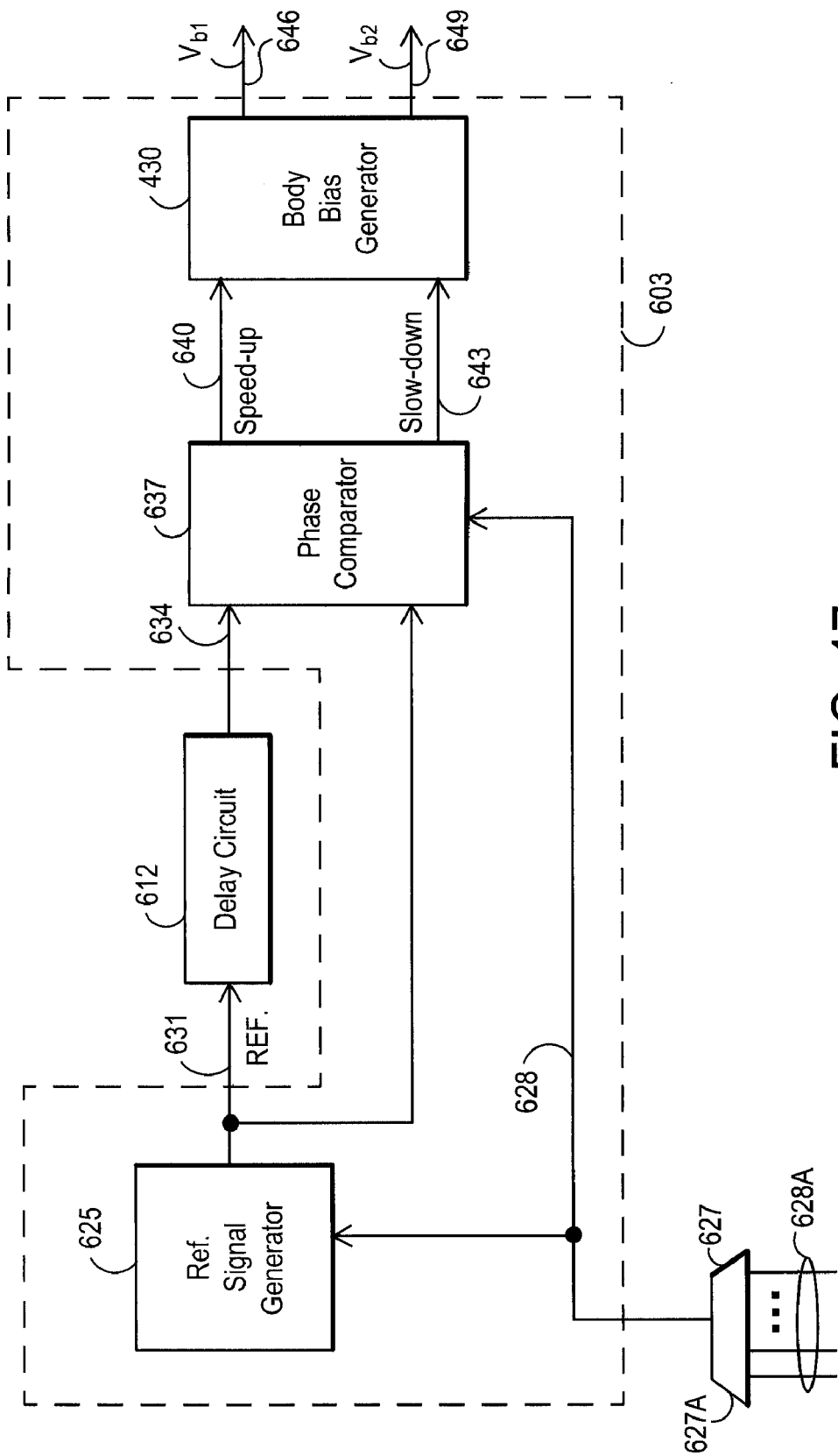
FIG. 17 illustrates a block diagram of a body-bias controller according to an illustrative embodiment of the invention.

FIG. 17 shows a block diagram of a body-bias controller 603 according to an illustrative embodiment of the invention. Body-bias controller 603 includes reference-signal generator 625, delay circuit 612, phase comparator 637, and body-bias generator 430. Optionally, body-bias controller 603 may include MUX 627, as described below in detail.

Reference-signal generator 625 generates reference signal 631 from clock signal 628. Depending on factors that depend on the actual design and implementation of the circuit (e.g., the relation of the delay in delay circuit 612 to the delay in user circuit 609), reference signal 631 may have a particular relation to clock signal 628, as desired. For example, reference signal 631 may have one half the frequency of clock signal 628. Reference signal 631 feeds delay circuit 612. In response, delay circuit 612 produces output signal 634, a delayed version of reference signal 631.

Note that one may optionally use MUX 627 to provide the capability to select one of a number of clock signals 628A, as desired. As described below in detail, body-bias controller 603 uses the period of clock signal 628 to measure the delay of a reference circuit, and uses the result of that measurement to generate and provide body-bias signals to various circuits in PLD 103. Through the selection signal 627A of MUX 627, one may select one of clock signals 628A such that the chosen clock signal has a desired or particular period. In that manner, one may increase the flexibility of body-bias controller 603.

Phase comparator 637 compares reference signal 631 and output signal 634 of delay circuit 612. Depending on the relative phases of the two signals, comparator 637 produces output signal 640 (speed-up) and output signal 643 (slow-down). Output signals 640 and 643 drive body-bias generator 430. Body-bias generator 430 produces body-bias signal(s) in response to output signals 640 and 643. In the particular example shown in FIG. 17, body-bias generator produces body-bias signal 646 ($V_{b1}$) and body-signal 649 ($V_{b2}$).

Figure 18:
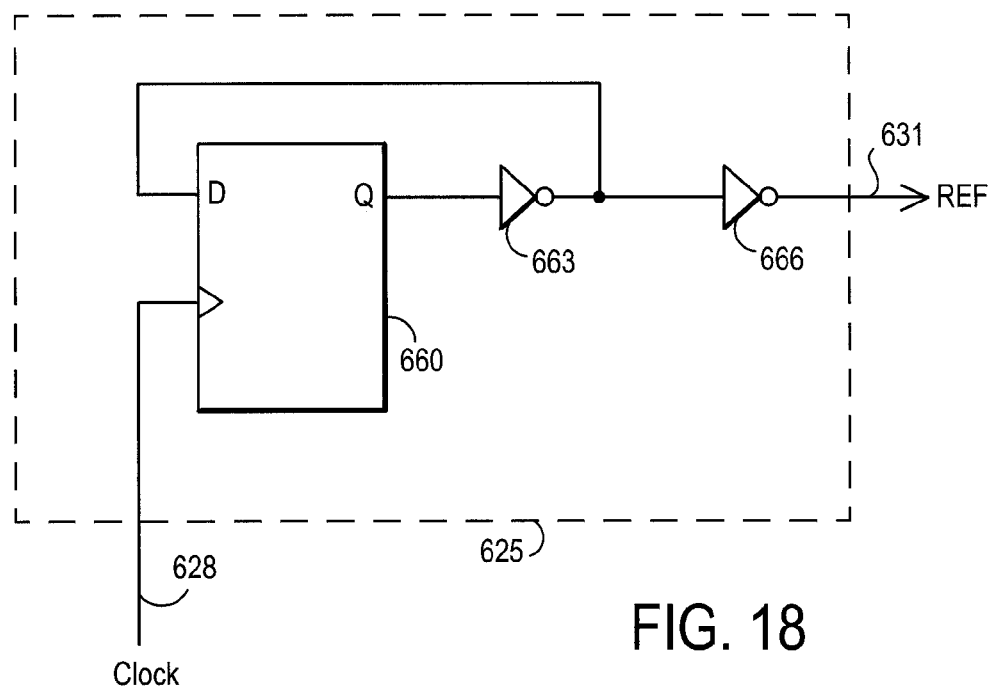
FIG. 18 depicts a circuit arrangement for reference-signal generator according to an exemplary embodiment of the invention.

FIG. 18 shows a circuit arrangement for reference-signal generator 625 according to an exemplary embodiment of the invention. Reference-signal generator 625 includes flip-flop 660, and inverters 663 and 666. In this particular example, reference-signal generator 625 constitutes a divide-by-two circuit. Thus, flip-flop 660 and inverter 663 generate a signal with half the frequency of clock signal 628. Inverter 666 buffers that signal to provide reference signal 631. Persons of ordinary skill in the art with the benefit of the description of the invention understand that, depending on circuit configuration and the application, one need not use inverter 666 and may omit it, as desired.

Figure 19:
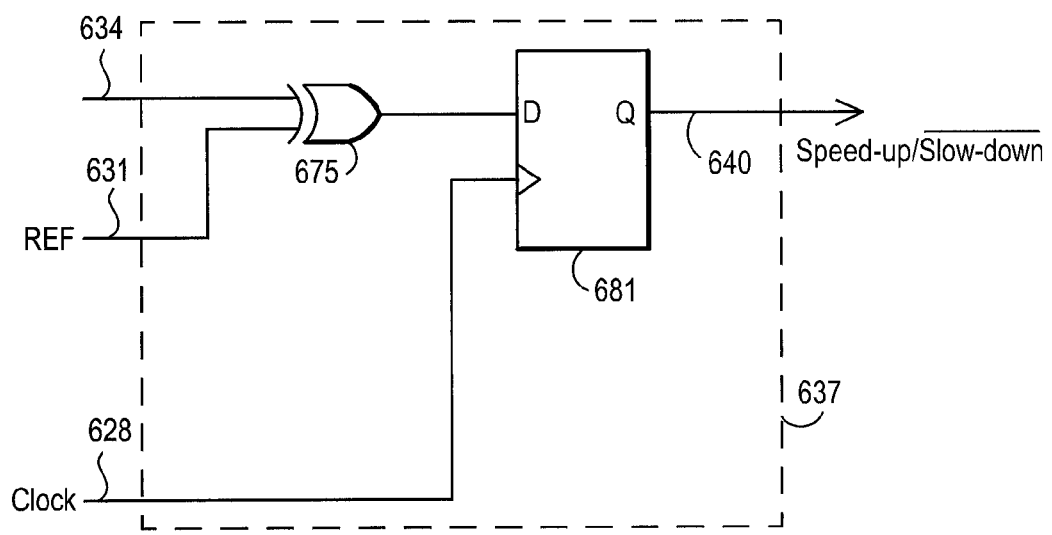
FIG. 19 shows a circuit arrangement for a phase comparator according to an exemplary embodiment of the invention.

FIG. 19 depicts a circuit arrangement for phase comparator 637 according to an exemplary embodiment of the invention. Comparator 637 includes exclusive-OR (XOR) gate 675, and flip-flop 681. Output of delay circuit 612 feeds one input of XOR gate 675. Reference signal 631 feeds a second input of XOR gate 675.

The output of XOR gate 675 feeds the data (D) input of flip-flop 681. Clock signal 628 drives flip-flops 681 and 684. Q Output of flip-flop 681 provides output signal 640 (SPEEDUP/SLOWDOWN). A high output signal indicates a circuit that is running too slowly (should have more forward body bias), and vice-versa (a low signal indicates that the circuit should have a more reverse body bias).

If the delay through delay circuit 612 is shorter than the period of clock signal 628, then the user circuit is operating too fast. In that case, the output of gate 675 would be a logic zero at the time of a rising transition of clock signal 628. Conversely, if the delay through delay circuit 612 is longer than the period of clock signal 628, then the user circuit is operating too slowly. Under those circumstances, XOR gate 675 provides a logic-high signal at its output at the time of a rising transition of clock signal 628. As a consequence, flip-flop 681 provides a speed-up output signal.

Figure 20:
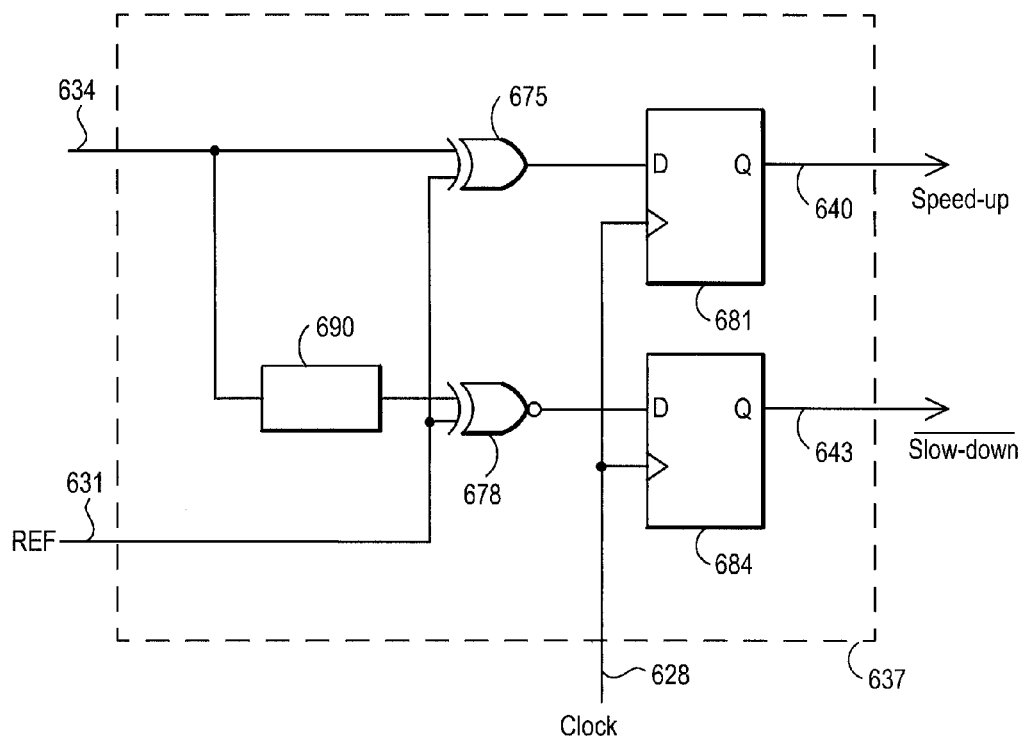
FIG. 20 illustrates another circuit arrangement for a phase comparator according to an exemplary embodiment of the invention.

FIG. 20 illustrates another circuit arrangement for phase comparator 637 according to an exemplary embodiment of the invention. Similar to FIG. 19, comparator 637 in FIG. 20 includes exclusive-OR (XOR) gate 675, exclusive-NOR (XNOR) gate 678, and flip-flops 681 and 684. In addition, comparator 637 in FIG. 20 includes dead-zone delay circuit 690. Dead-zone delay circuit 690 causes more stable and power-efficient body-bias adjustment of transistors within PLD 103.

More specifically, dead-zone delay circuit 690 causes XNOR gate 678 to receive a delayed version of reference signal 634, rather than reference signal 634 itself. In the absence of dead-zone delay circuit 690, comparator 637 may repeatedly and alternately assert its speed-up and slow-down output signals as it seeks to find an equilibrium speed, leakage, and power consumption for user circuit 609. The repeated body-adjustment (charging and discharging of the transistors bodies) might cause increased power consumption and, hence, less efficiency.

Dead-zone delay circuit 690 helps comparator 637 to experience less "chatter" at its output. Put another way, in the case of comparator 637 including both delay circuit 612 and dead-zone delay circuit 690 (i.e., FIG. 20), one delay circuit forms a minimum delay, and the sum of both forms a maximum delay. If the period of clock signal 628 exceeds the sum of both delays, then user circuit 609 is operating too fast. As a result, comparator 637 asserts the slow-down output signal.

Conversely, if the clock period is shorter than the delay of delay circuit 612, then user circuit 609 is operating too slowly. Consequently, comparator 637 asserts the speed-up output signal. If user circuit 609 operates within an acceptable or prescribed range of speeds (with corresponding leakage and power-consumption levels), then comparator 637 does not assert either of its output signals. Consequently, comparator 637 avoids repeated alteration of its output signals in order to achieve an acceptable operating speed of user circuit 609.

Note that delay circuit 612 might provide either a fixed or adjustable or configurable delay. In the case of a fixed delay, delay circuit 612 includes a logic circuit with a desired or prescribed delay. For example, delay circuit 612 may include an arrangement of combinational logic elements, such as gates. One may implement delay circuit 612 using the programmable resources of PLD 103, such as programmable logic 106 and programmable routing or interconnect 109 (see FIG. 1).

Figure 21:
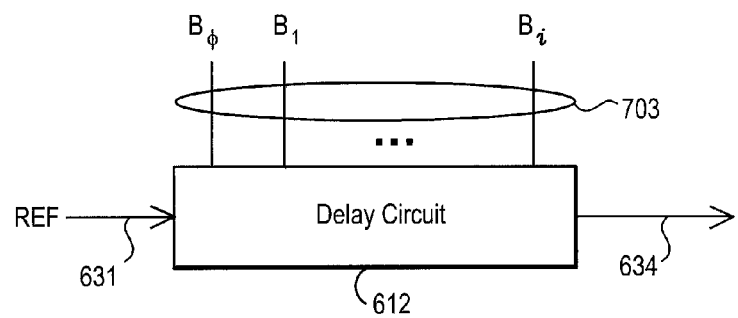
FIG. 21 depicts a configurable delay circuit for use in illustrative embodiments according to the invention.

Alternatively, delay circuit 612 may have a configurable delay. FIG. 21 depicts a configurable delay circuit 612 for use in illustrative embodiments according to the invention. Delay circuit 612 in FIG. 21 accepts a set of configuration or adjustment signals 703. Signals 703 include a set of bits, denoted as $B_0$ through $B_i$. Configuration signals 703 adjust or configure the delay of delay circuit 612. In other words, by setting the values of the bits in configuration signals 703, one may adjust the amount of time by which delay circuit 612 delays its input signal in order to generate its output signal.

Figure 22:
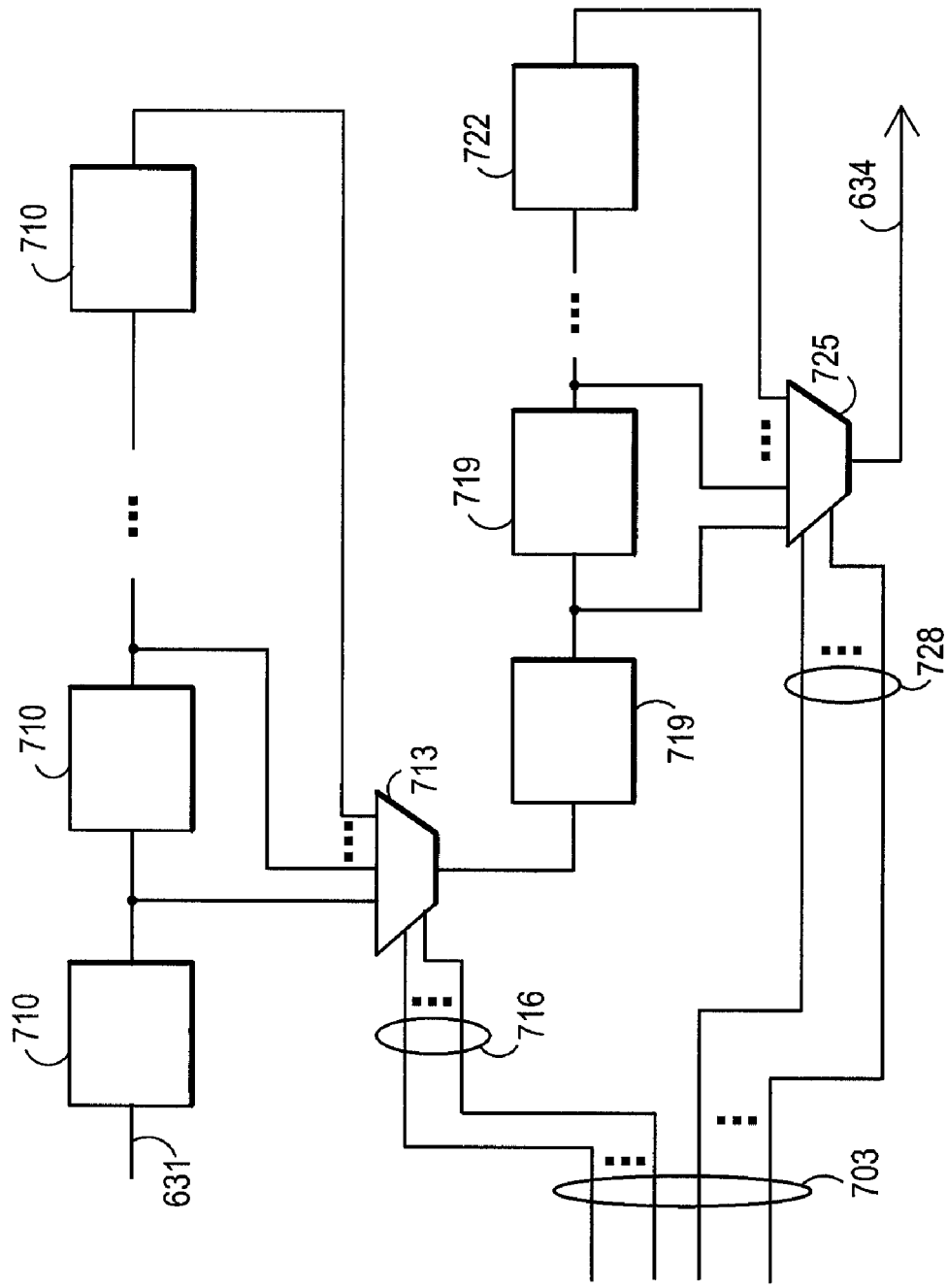
FIG. 22 shows a circuit arrangement for a configurable delay circuit according to an exemplary embodiment of the invention.

FIG. 22 shows a circuit arrangement for a configurable delay circuit according to an exemplary embodiment of the invention. The configurable delay circuit includes a cascade coupling of a set of interconnect or routing delay elements 710, a cascade coupling of a set of logic delay elements 719, MUX 713, and MUX 725.

The output signals of the routing delay elements 710 constitute inputs signals of MUX 713. MUX 713 also receives one or more selection signal(s) 716. The number of selection signals 716 depends on the number of routing delay elements 710, as person of ordinary skill in the art with the benefit of the description of the invention understand. Through selection signal(s) 716, one may selectively couple the output of one of routing delay elements 710 to the output of MUX 713. Thus, one may configure the amount of delay from the input signal (reference signal 631) of the first routing delay element to the output of MUX 713.

Similarly, output signals of logic delay elements 719 provide the inputs signals of MUX 725. MUX 725 also receives one or more selection signal(s) 728. The number of selection signals 728 depends on the number of logic delay elements 719, as person of ordinary skill in the art with the benefit of the description of the invention understand. By using selection signal(s) 728, one may selectively couple the output of one of logic delay elements 719 to the output of MUX 728. Accordingly, one may configure the amount of delay from the input signal of the first logic delay element (i.e., the output signal of MUX 713) to the output of MUX 725.

By using MUX 713 and MUX 725, one may configure the delay of the configurable delay circuit to constitute a combination of the respective delays of a desired number of routing delay elements 710 and logic delay elements 719. Thus, one may configure the delay circuit (e.g., through the PLD configuration software, described above in detail) so that its delay represents the delay of the user's circuit. Furthermore, one may configure the delay in a dynamic manner (in response to changing operating environment, external control, user control, etc.), as desired.

Figure 23:
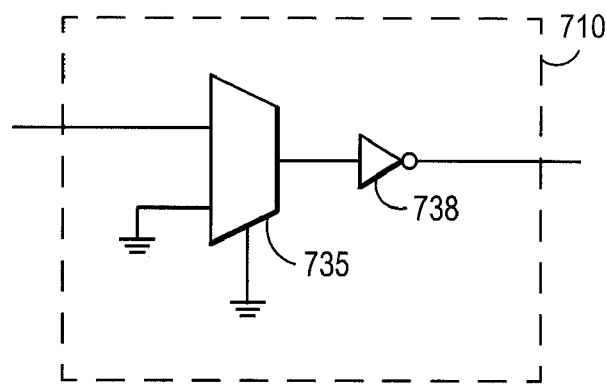
FIG. 23 illustrates a circuit arrangement for a routing delay element according to an illustrative embodiment of the invention.

FIG. 23 shows a circuit arrangement for a routing delay element 710 according to an illustrative embodiment of the invention. Routing delay element 710 includes MUX 735 and inverter 738. Together, MUX 735 and inverter 738 seek to represent a typical routing mechanism (including its corresponding delay) within PLD 103. MUX 735 has one of its inputs and its selection input grounded, so that it couples its input signal to the input of inverter 738. The output signal of inverter 738 constitutes the output signal of routing delay element 738. Thus, routing delay logic 710 provides as its output signal an inverted version of its input signal.

Figure 24:
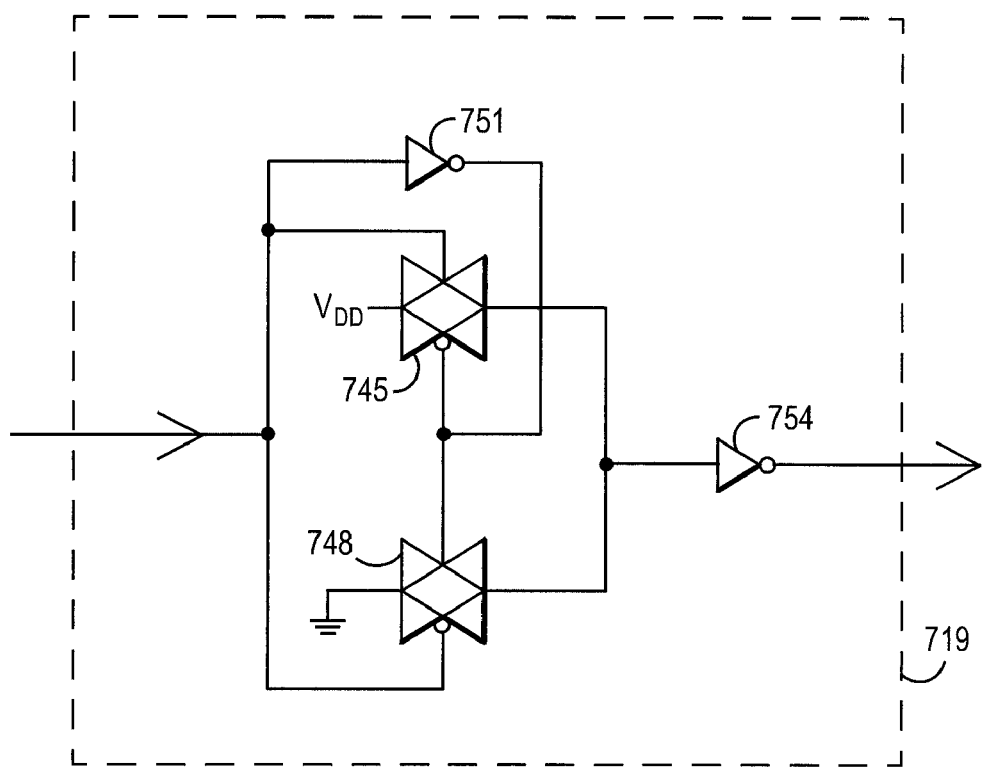
FIG. 24 depicts a circuit arrangement for a logic delay element according to an exemplary embodiment of the invention.

FIG. 24 illustrates a circuit arrangement for a logic delay element 719 according to an exemplary embodiment of the invention. Logic delay element 719 includes transmission gate 745, transmission gate 748, inverter 751, and inverter 754. Together, the circuit elements within logic delay element 719 seek to represent a programmable logic circuit (and its corresponding delay) within PLD 103. Transmission gates 745 and 748 and inverter 751 provide a mechanism for coupling the input signal (regardless of its logic value) to the input of inverter 754. The output signal of inverter 754 constitutes the output signal of logic delay element 719. Thus, logic delay logic 719 provides as its output signal an inverted version of its input signal.

Note that the figures (e.g., FIGS. 18-20 and 22-24) provide merely illustrative embodiments of the respective circuits they represent. As persons of ordinary skill in the art with the benefit of the description of the invention appreciate, depending on factors such as design and performance specifications, one may use other circuits and embodiments, as desired.

As merely one example, rather than using a comparator with discrete-time output values, one may use a comparator with continuous-time output values. Furthermore, one may use more than one body-bias controller 603 (and comparator), as desired, in order to provide adjustable or programmable body-bias signals to various parts of PLD 103.

As another example, one may realize the various circuits in the figures (e.g., body-bias controller 603) using dedicated circuitry, for example, as part of control circuitry 136 (see FIG. 1), as desired. As an alternative, one may implement those circuits in the programmable resources of PLD 103 (see, for example, FIGS. 1, 3, and 4), i.e., programmable logic 106 and programmable interconnect 109, as desired. Persons of ordinary skill in the art with the benefit of the description of the invention appreciate that one may use a combination of the two approaches. In other words, one may realize the circuitry in part by using the programmable resources of PLD 103 and in part by using dedicated circuitry, as desired. If the implementation uses PLD programmable resources, the PLD CAD software (see, for example, FIG. 6A and accompanying description) places and routes the various circuit elements within the programmable fabric (programmable logic 106 and programmable interconnect 109) of PLD 103.

In addition, the PLD CAD software selects, places, and routes the circuit elements (combinational logic elements or routing delay elements 710 and logic delay elements 719) that implement delay circuit 112. The PLD CAD software selects the circuit elements such that delay circuit 612 represents the delay of user circuit 609. The PLD CAD software programs values in bits of configuration memory 133 (see FIG. 1) that subsequently provide values for various configuration or programming signals, such as MUX selection signal 627A (see FIG. 17) and configuration signals 703 (see FIG. 21). In an alternative embodiment, the user may define the parameters of delay circuit 612 to model user circuit 609. The alternative embodiment provides the user with the ability to match the performance of the PLD's circuitry to the user's specifications or requirements.

Note that, rather than using one delay circuit 612 and comparator 637, one may instead use multiple delay circuits 612 and/or comparators 637, as desired. By doing so, one may provide more resolution of the delay provided by the delay chain and therefore improved convergence of the body-bias controller.

Another aspect of the disclosure relates to adjusting or programming directly the performance (leakage, speed, and power dissipation) of transistors in ICs generally (rather than use a delay circuit that models the performance of the circuit that includes those transistors). More particularly, one may use leakage-locked loops (LLLs) to set the leakage level of one or more transistors in an IC by programming or adjusting the body bias of the transistor(s).

The leakage-locked loop technique has the advantage that it provides the capability of directly controlling the leakage of the circuit, rather than an indirect control by using a representative delay as a measure of the leakage currents. The technique allows the user to specify a tolerable or desired leakage level and select and specify a desired tradeoff between performance and leakage currents and power dissipation. Note that one may apply the leakage-locked loop concept to ICs generally, including PLDs.

Figure 25:
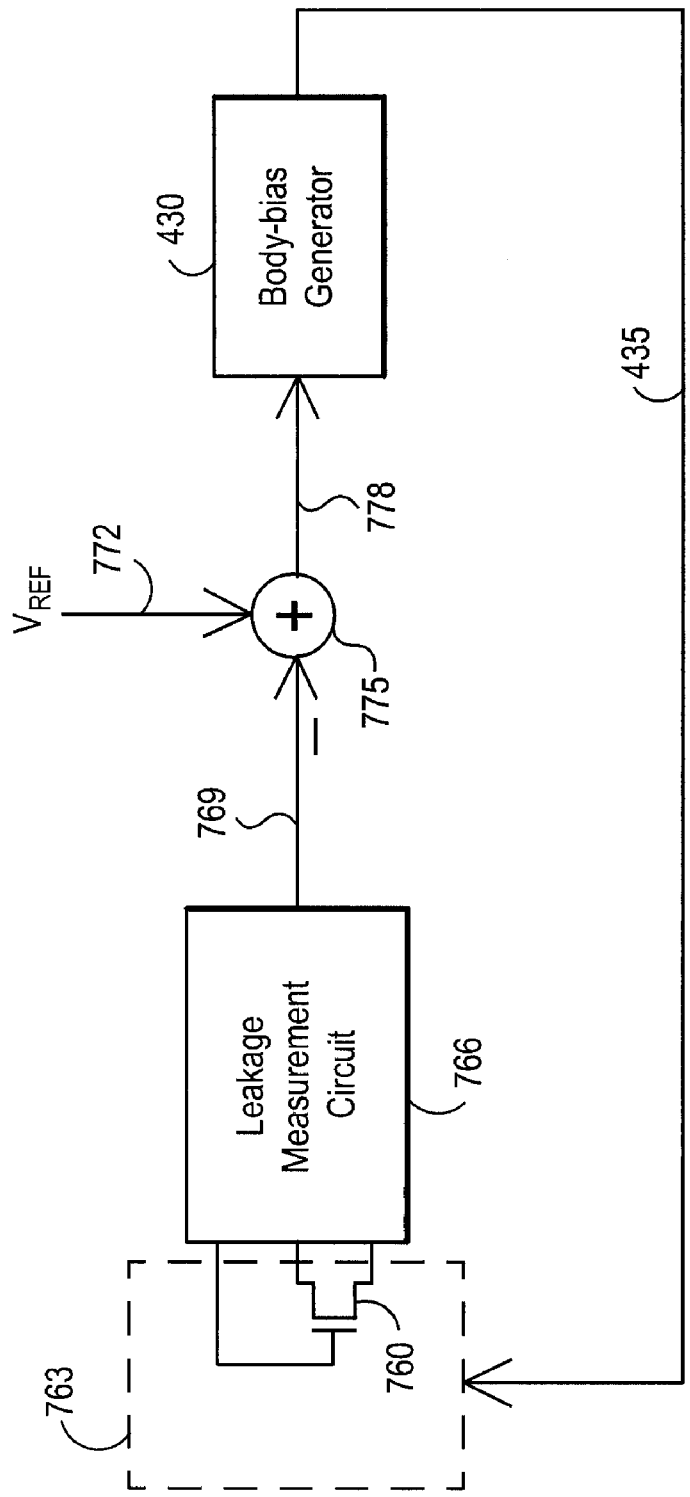
FIG. 25 shows a block diagram of a leakage-locked loop according to an illustrative embodiment of the invention.

FIG. 25 shows a block diagram of a leakage-locked loop according to an illustrative embodiment of the invention. The leakage-locked loop includes reference transistor 760, leakage measurement circuit 766, adder 775, and body-bias generator 430. Generally speaking, the leakage-locked loop includes a negative-feedback circuit. It uses reference transistor 760 to measure the leakage current of transistors in IC circuit 763, and uses the measured leakage current to generate the body-bias signals for those transistors.

Note that one may design other embodiments of the leakage-locked loop that measure other quantities, and adjust the body bias of one or more transistors so as to meet one or more user-specified criteria, as desired, and as persons of ordinary skill in the art who have the benefit of the description of the invention understand. Examples of such quantities include threshold voltage ($V_T$) of a reference transistor, or the saturation current ($I_{dsat}$) of a reference, transistor.

Reference transistor 760 resides in IC circuit 763. Note that one may use more than one reference transistor 760, as desired (for example, to measure leakage currents in more than one location in IC circuit 763). IC circuit 763 constitutes the circuitry within an IC whose performance one seeks to adjust or program through body-bias levels. For example, in the situation that the IC is a PLD, IC circuit 763 may constitute user circuit 609 (see, for example, FIG. 16).

Generally, one selects IC circuit 763 to include a sufficiently small part of the circuitry within the IC so that the transistors within it (including reference transistor 760) have similar electrical characteristics and that variations in conditions (e.g., process, voltage, and temperature, or PVT) do not substantially degrade the programming of the body-bias across IC circuit 763.

Leakage measurement circuit 766 measures the leakage of reference transistor 760, and provides a leakage signal 769 to adder 775. Adder 775 compares leakage signal 769 to a reference leakage signal ($v_{ref}$) 772 to generate error signal 778. Body-bias generator 430 uses error signal to generate one or more body-bias signals 435. Body-bias generator 430 provides the body-bias signal(s) 435 to desired transistors within IC circuit 760.

Note that one may use configurable components in the leakage-locked loop of FIG. 25, as desired. For example, one may use a configurable leakage measurement circuit 766 (configurable gain), a configurable adder 775 (configurable gain) or a separate gain block following adder 775, a configurable reference leakage signal 772 (configurable level), and/or configurable gain in body-bias generator 430, as desired. Note that one may use the PLD configuration RAM bits, signals from user circuits on the PLD, or a combination of the two, to configure each of those configurable components, as desired.

Figure 26:
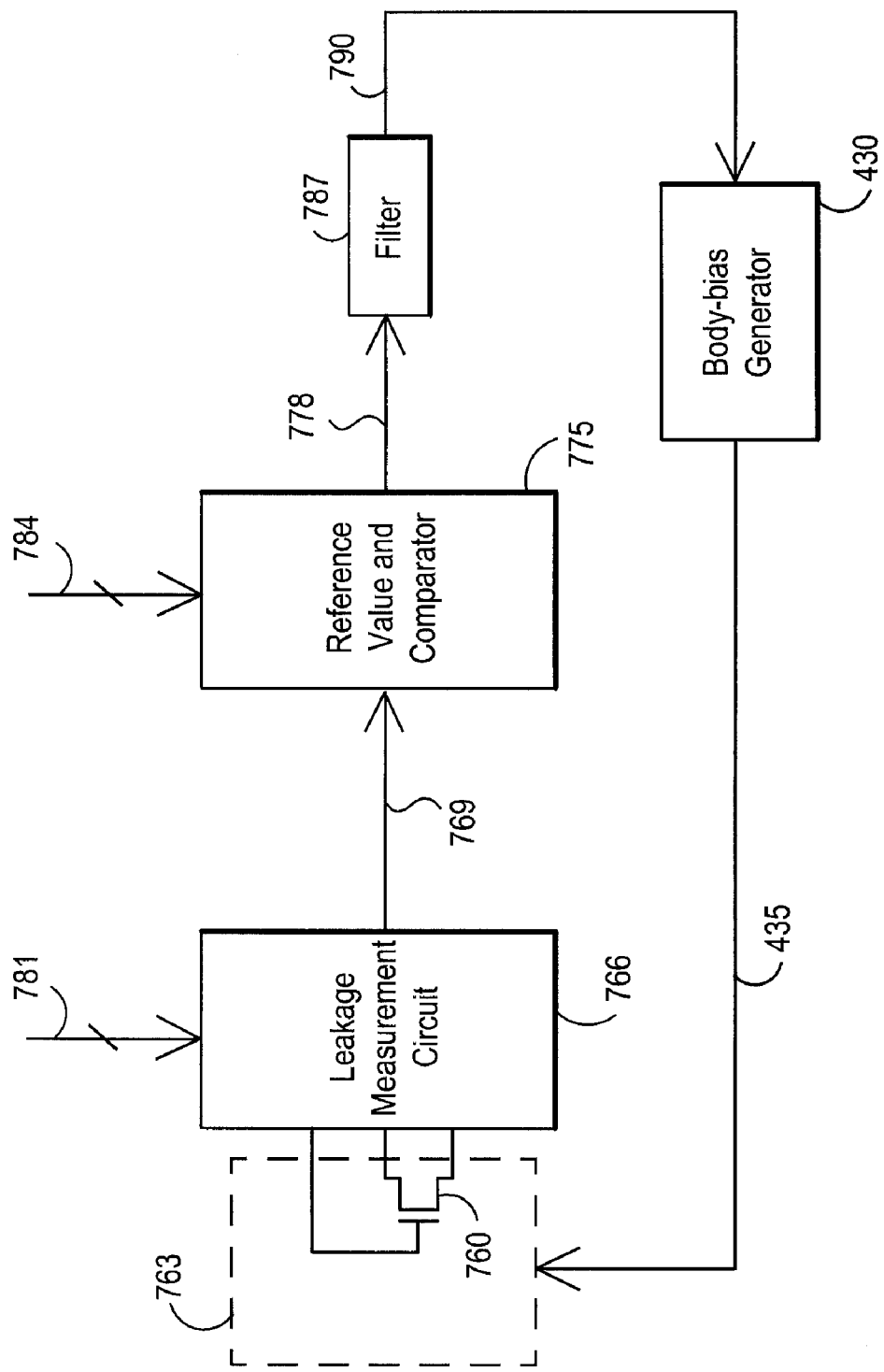
FIG. 26 illustrates a block diagram of a leakage-locked loop according to another exemplary embodiment of the invention.

FIG. 26 illustrates a block diagram of a leakage-locked loop according to another exemplary embodiment of the invention. The leakage-locked loop in FIG. 26 includes reference transistor 760 (which resides in IC circuit 763), leakage measurement circuit 766, reference value and comparator circuit 775, filter 787, and body-bias generator 430.

Reference transistor 760 and IC circuit 763 have the same or similar configurations to those described above in connection with FIG. 25. Leakage measurement circuit 766 provides programmable gain through control signals 781. More specifically, through control signals 781, one may adjust the gain that leakage measurement circuit 766 applies to the measured leakage current in order to provide leakage signal 769.

Reference value and comparator circuit 775 processes leakage signal. Reference value and comparator circuit 775 provides a programmable reference value, a programmable gain, or both, as desired, through control signals 784. In other words, through control signals 784, one may adjust the reference leakage signal (analogous to reference leakage signal 772 in FIG. 25), the gain of the comparator (not shown explicitly) that compares the leakage signal 769 to the reference leakage signal to generate leakage error signal 778, or both, as desired. Reference value and comparator circuit 775 may optionally include a quantizer that quantizes the output signal of the comparator, as desired.

Filter 787 filters and processes leakage error signal 778 to produce a filtered signal 790. Body-bias generator 430 operates in the manner described above in connection with FIG. 25 to provide one or more body-bias signals to IC circuit 263.

Note that one may omit filter 787 from the leakage-locked loop, as desired. Filter 787 may have a desired transfer function, such as a gain block or circuit, a low-pass transfer function or an integrator transistor function. The choice of whether to include filter 787 and its particular transfer function depend on design and performance specifications and considerations, as persons of ordinary skill in the art who have the benefit of the description of the invention understand.

Figure 27:
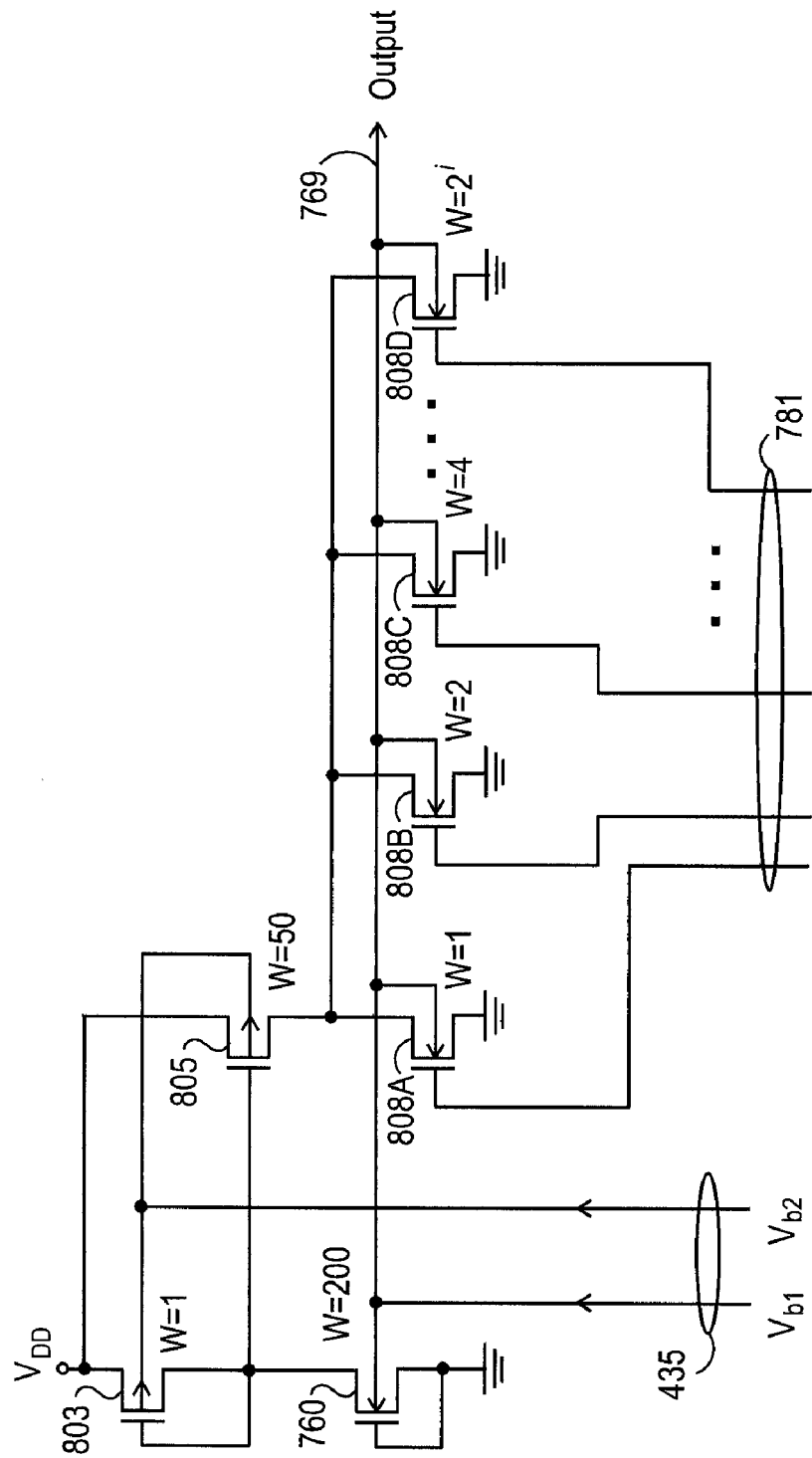
FIG. 27 depicts a leakage measurement circuit according to an illustrative embodiment of the invention.
Figure 28:
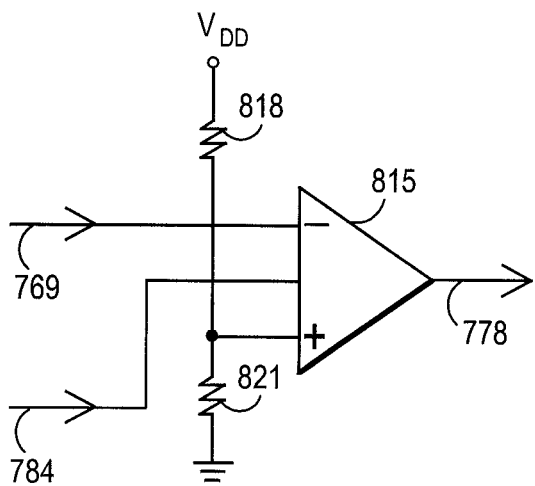
FIG. 28 shows a reference value and comparator circuit according to an illustrative embodiment of the invention.
Figure 29:
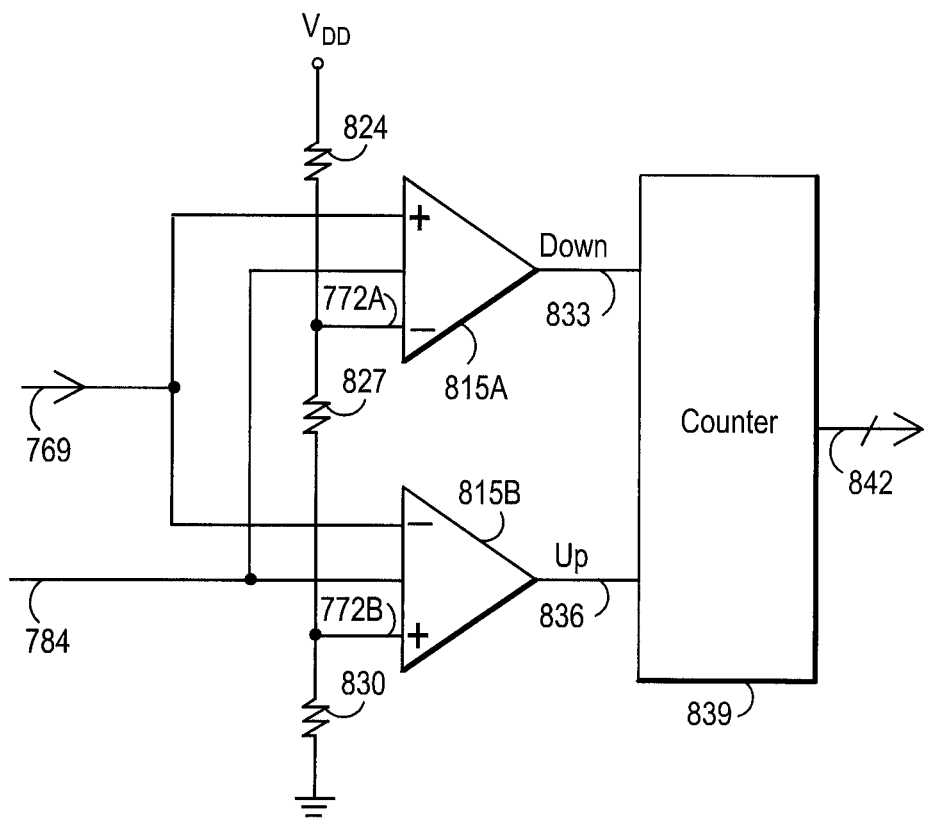
FIG. 29 illustrates a reference value and comparator circuit according to another exemplary embodiment of the invention.

One may implement leakage measurement circuit 766 and reference value and comparator circuit 775 in a variety of ways, as desired. The choice of circuitry and implementation depends on a variety of factors (e.g., IC technology used, desired performance characteristics, etc.), as persons skilled in the art with the benefit of the description of the invention understand. FIGS. 27-29 provide some examples.

FIG. 27 depicts a leakage measurement circuit 766 according to an illustrative embodiment of the invention. Leakage measurement circuit 766 includes PMOS transistors 803 and 805, reference transistor 760, and a plurality of NMOS transistors 808A-808D.

The gate of reference transistor 760 couples to its source, which causes reference transistor 760 to be in the OFF state. Thus, the current conducted through reference transistor 760 represents its leakage current. Transistor 803 couples in series with reference transistor 760. The gate of transistor 803 couples to its drain (the so-called "diode-connected" configuration).

Transistor 803 and transistor 805 form a current mirror. The current mirror amplifies the leakage current (the current through reference transistor 760). The level of amplification depends on the relative sizes of transistors 803 and 805, as persons of ordinary skill in the art who have the benefit of the description of the invention understand.

The current amplified by the current mirror flows through any of transistors 808A-808D that are in the ON state. Transistors 808A-808D provide a configurable output current (leakage current 769). One may configure the output current by selectively turning ON transistors 88A-808D by applying appropriate levels of control signals 781. Generally, for a control signal 781 that has i bits, one may provide $2^i$ levels of reference current. Transistors 808A-808D may have relative sizes selected so as to provide a desired reference current profile in response to control signals 781.

As persons of ordinary skill in the art with the benefit of the description of the invention understand, one may use a variety of combinations of the numbers and sizes of transistors. As one example, one may size transistors 808A-808D such that each of transistors 808B-808D has twice the width of the preceding transistor (a binary-weighted configuration). In one illustrative embodiment, for a given channel length, transistor 760 has a width of 200, transistor 803 a width of 1, transistor 805 a width of 50, transistor 808A a width of 1, and transistors 808B-808D have binary-weighted widths (i.e., a width of 2 for transistor 808B, a width of 4 for transistor 808C, and so on).

FIG. 28 shows a reference value and comparator circuit 775 according to an illustrative embodiment of the invention. The circuit includes resistor 818, resistor 821, and comparator 815. Resistors 818 and 821 form a voltage divider that provides leakage reference signal 772 to comparator 815. One may select values of resistors 818 and 821 so as to provide a desired reference level. Comparator 815 compares leakage signal 769 to leakage reference signal 772 to provide leakage error signal 778. Comparator 815 may have a configurable gain (in response to control signal(s) 784), as desired. Note that FIG. 28 shows a simplified comparator 815, and that comparator 815 may include stable reference circuit to provide a relatively accurate reference voltage, as desired.

FIG. 29 illustrates a reference value and comparator circuit 775 according to another exemplary embodiment of the invention. The circuit includes resistor 824, resistor 827, resistor 830, comparator 815A, comparator 815B, and counter 839. Comparators 815A and/or 815B may have a configurable gain (in response to control signal(s) 784), as desired.

Reference value and comparator circuit 775 in FIG. 29 is similar to the circuit in FIG. 28, but it uses two reference signals so as to provide a lower bound and an upper bound for the leakage current. More specifically, resistors 824, 827, and 830 form a voltage divider that provides leakage reference signal 772A to comparator 815A and leakage reference signal 772B to comparator 815B. Leakage reference signals 772A and 772B constitutes bounds for the leakage current. Put another way, leakage reference signals 772A and 772B provide a "window" of values for the leakage current. One may select values of resistors 824, 827, and 830 so as to provide desired levels of leakage reference signals 772A and 772B.

Comparator 815A compares leakage signal 769 to leakage reference signal 772A to provide DOWN signal 833. DOWN signal 833 causes counter 839 to count down (i.e., cause the IC circuit's speed of operation to decrease). Conversely, comparator 815B compares leakage signal 769 to leakage reference signal 772B to provide IP signal 836. UP signal 836 causes counter 839 to count up (i.e., cause the IC circuit's speed of operation to increase). Put another way, counter 839 is analogous to using an integrator as filter 787 in FIG. 26. The count signals 842 provide the current count value of counter 839. Body-bias generator 430 (not shown in FIG. 29) uses count signals 842 to generate body-bias signal(s) 435 (not shown in FIG. 29) and supply the signal(s) to IC circuit 763.

To provide further control or programming of body-bias levels, one may include within an IC more than one body-bias generator circuit 430, as desired. In such a configuration, each body-bias generator 430 provides one or more body-bias signals 435 to a circuit (such as IC circuit 763) or region within the IC.

Thus, one may program the body-bias generators 430 to provide specific or individualized body-bias signals for each circuit or region of the IC. As an alternative, the user may specify or provide programming for the body-bias generators 430 so as to generate desired numbers and levels of body-bias signals 435 for a given circuit or region of the IC. The specifically tailored or programmed body-bias levels allow trading off performance and leakage and power dissipation for each circuit or region of the IC. As a result, the user has increased control, with finer granularity, over the performance-power trade-off for various parts and circuits within the IC.

Figure 30:
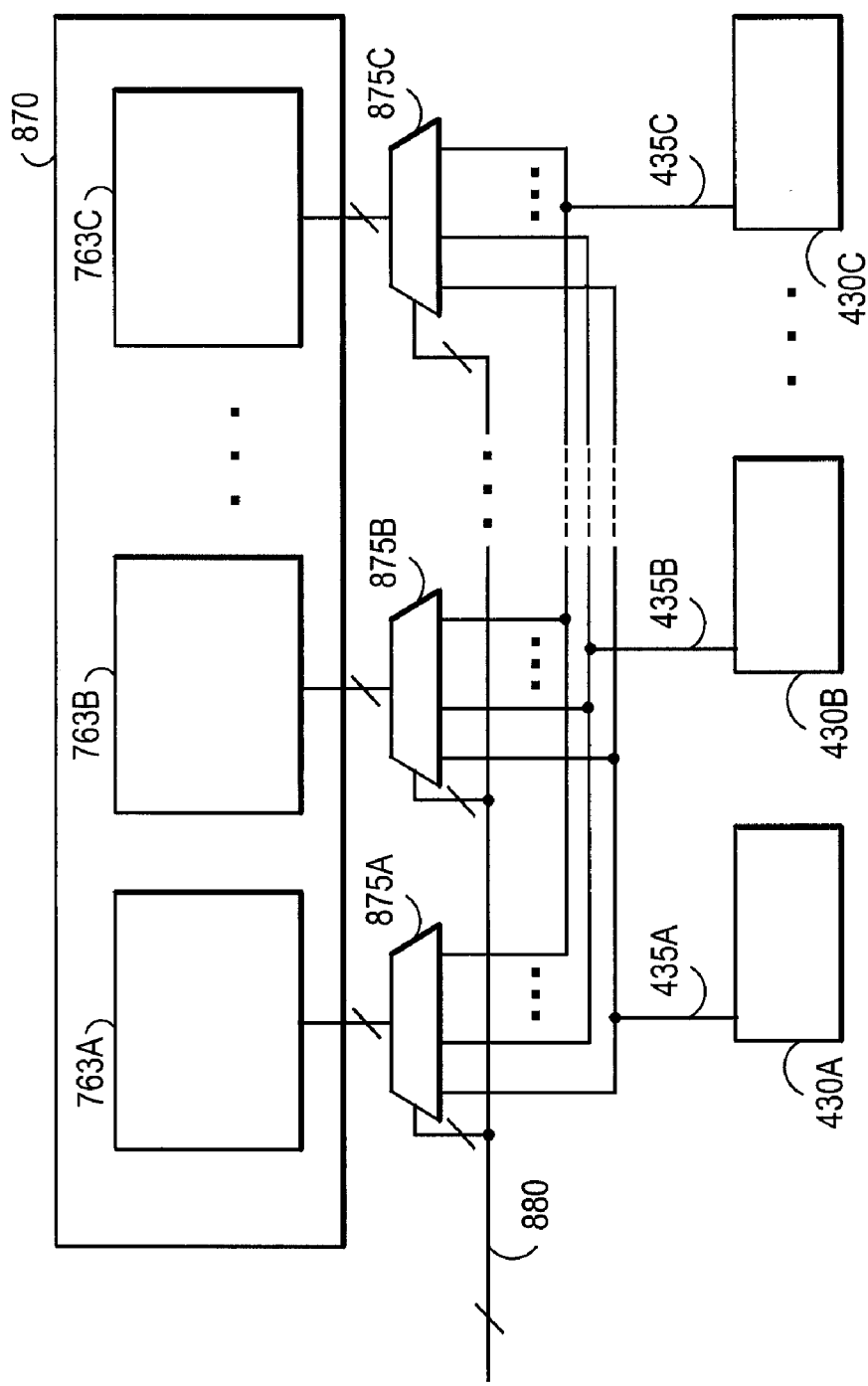
FIG. 30 depicts a circuit arrangement according to an exemplary embodiment of the invention for providing multiple body-bias circuits in an IC.

FIG. 30 depicts a circuit arrangement according to an exemplary embodiment of the invention for providing multiple body-bias circuits in an IC. The circuit arrangement includes IC region 870, a set of IC circuits 763A-763C, a corresponding number of MUXs 875A-875C, and a set of body-bias generators 435A-435C.

Each of body-bias generators 430A-430C generates one or more body-bias signals, denoted as body-bias signal(s) 435A-435C, and provides the signal(s) to each of MUXs 875A-875C. In response to selection signals 880, each of MUXs 875A-875C selects the body-bias signal(s) from one of body-bias generators 435A-435C and provides the selected body-bias signal(s) to a corresponding one of IC circuits 763A-763C.

Rather than using MUXs 875A-875C, one may use programmable non-volatile coupling mechanisms (such as fuses). In such a situation, one may test individual ICs after manufacture to determine its characteristics (e.g., level of leakage) and program the non-volatile coupling mechanisms so as to provide desired or appropriate body-bias signal(s) to various regions or circuits of the IC. By including a number of body-bias generators, one may give the user the ability to independently program the body-bias levels of those regions or circuits.

In another embodiment, one may use a combination of values stored in non-volatile memory (such as values relating to the characteristics of the IC (e.g., leakage levels) or particular regions or circuits within it) and user-configured or user-specified values to generate body-bias levels. This scheme allows taking into account both the characteristics of the IC and the user-specified parameters in order to trade off performance and power dissipation and leakage levels.

In the case of a PLD, PLD region 870 may constitute PLD region 606 (see, for example, FIG. 25), and each IC circuit 763 may correspond to a user circuit 609. One may provide one or more tailored or programmed body-bias signals 435 for each user circuit 609 (see, for example, FIG. 25) in PLD 103. In another embodiment, IC circuits 763 may correspond to a physically proximate set of PLD circuits (programmable logic 106 and programmable interconnect 109) or a selected group of programmable logic 106 and programmable interconnect 109 (for example, a group of programmable logic circuits 106 arranged in a rectangular array in FIG. 3).

FIG. 30 illustrates body-bias generators 430A-430C as the circuitry that provides body-bias signals 435A-435C. In the case of a PLD, one may generally use body-bias controllers 603A-603C (see, for example, FIG. 25), rather than body-bias generators 430A-430C.

Note that FIG. 30 illustrates IC region 870 as including IC circuits 763A-763C. As persons of ordinary skill in the art with the benefit of the description of the invention understand, however, the reverse situation may exist (i.e., each IC circuit may include one or more IC region 870.

Note further that one may combine the performance-tuning concepts described above with other techniques to reduce power densities or keep them within safe ranges. For example, one may turn ON or OFF various circuits within the PLD (see FIG. 9 and accompanying description) to accomplish a tradeoff between desired performance levels and safe or prescribed power consumption levels or power densities. Other variations and embodiments will be apparent to persons of ordinary skill in the art who have the benefit of the description of the invention.

Generally, note that one may apply the inventive concepts effectively to various programmable logic circuitry or ICs known by other names in the art, as desired, and as persons skilled in the art with the benefit of the description of the invention understand. Such circuitry include devices known as complex programmable logic device (CPLD), programmable gate array (PGA), and field programmable gate array (FPGA).

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown.

For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred or illustrative embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

We claim:

1. A programmable logic device (PLD), comprising:
   a reference transistor, the reference transistor configured to provide a current related to a circuit in the programmable logic device (PLD);
   a current measurement circuit, the measurement circuit configured to measure the current provided by the reference transistor to provide a measured current signal; and
   a body-bias generator, the body-bias generator configured to derive at least one body-bias signal from the measured current signal, the body-bias generator further configured to provide the at least one body-bias signal to the circuit in the programmable logic device (PLD).

2. The programmable logic device (PLD) according to claim 1, further comprising a comparator coupled to the current measurement circuit and to the body-bias generator, the comparator configured to derive a signal by comparing the measured current signal with a reference signal, the comparator further configured to provide the signal to the body-bias generator.

3. The programmable logic device (PLD) according to claim 2, further comprising a filter coupled between the comparator and the body-bias generator.

4. The programmable logic device (PLD) according to claim 3, wherein the filter comprises an integrator.

5. The programmable logic device (PLD) according to claim 2, wherein the current measurement circuit comprises a current mirror, the current mirror configured to amplify the current provided by the reference transistor to provide an amplified current.

6. The programmable logic device (PLD) according to claim 5, wherein the current measurement circuit further comprises a current scaling circuit, the current scaling circuit configured to scale the amplified current.

7. The programmable logic device (PLD) according to claim 2, wherein the comparator comprises a configurable comparator.

8. The programmable logic device (PLD) according to claim 1, further comprising first and second comparators coupled to the current measurement circuit and to the body-bias generator, the first and second comparators configured to derive a pair of signals by comparing the measured current signal with first and second current reference signals, the first and second comparators further configured to provide the pair of signals to the body-bias generator.

9. The programmable logic device (PLD) according to claim 2, wherein the first and second current reference signals correspond, respectively, to a lower leakage value and a higher leakage value.

10. The programmable logic device (PLD) according to claim 9, further comprising a counter coupled to the first and second comparators, the counter configured to count in response to the pair of signals provided by the first and second comparators, the counter further configured to provide a count value to the body-bias generators.

11. The programmable logic device (PLD) according to claim 10, wherein the first comparator comprises a configurable comparator, and wherein the second comparator comprises a configurable comparator.

12. The programmable logic device (PLD) according to claim 1, wherein the circuit in the programmable logic device (PLD) comprises programmable logic.

13. The programmable logic device (PLD) according to claim 12, wherein the circuit in the programmable logic device (PLD) comprises programmable interconnect.

14. The programmable logic device (PLD) according to claim 1, wherein the measured current signal comprises a leakage current signal.

15. The programmable logic device (PLD) according to claim 1, wherein the measured current signal comprises a current derived from a threshold voltage ($V_T$) of a transistor.

16. The programmable logic device (PLD) according to claim 1, where in the measured current signal comprises a saturation current ($I_{dsat}$) of a transistor.

17. A programmable logic circuit (PLD), comprising:
    means for obtaining a leakage current in a circuit;
    means for generating a measured leakage current by measuring the leakage current; and
    means for programming a body-bias of a transistor in the circuit in response to the measured leakage current.

18. The programmable logic circuit (PLD) according to claim 17, wherein the means for obtaining a leakage current resides in the circuit.

19. The programmable logic circuit (PLD) according to claim 17, further comprising means for comparing the measured leakage current to at least one leakage reference signal.

20. The programmable logic circuit (PLD) according to claim 19, wherein the means for comparing provides at least one output signal to the body-bias generator.

21. The programmable logic circuit (PLD) according to claim 20, further comprising means for generating at least one processed signal by processing the at least one output signal of the means for comparing, and for providing the at least one processed signal to the body-bias generator.

22. The programmable logic circuit (PLD) according to claim 19, wherein the means for comparing the measured leakage current compares the measured leakage current to first and second leakage reference signals, and wherein the first and second reference signals correspond to a desired range of leakage currents in the circuit.

23. A method of adjusting a leakage level of a transistor in a circuit embodied within a programmable logic circuit (PLD), the method comprising:

obtaining a current that represents a leakage current of the transistor;

deriving a body-bias level from the obtained current; and adjusting the body bias of the transistor to the derived body-bias level.

24. The method according to claim 23, wherein obtaining a current that represents a leakage current of the transistor further comprises measuring a leakage current in the circuit.

25. The method according to claim 23, wherein deriving a body-bias level from the obtained current further comprises comparing the obtained current to at least one leakage reference value to generate at least one error signal.

26. The method according to claim 25, wherein deriving a body-bias level from the obtained current further comprises deriving the body-bias level from the at least one error signal.

27. The method according to claim 26, wherein deriving a body-bias level from the obtained current further comprises:

filtering the at least one error signal to generate a filtered signal; and deriving the body-bias level from the filtered signal.

28. The method according to claim 25, wherein comparing the obtained current to at least one leakage reference value further comprises comparing the obtained current to first and second leakage reference values, wherein the first and second leakage reference values define a range of leakage currents of the transistor.

* * * * *